United States Patent
Yamazaki

(10) Patent No.: US 12,176,359 B2
(45) Date of Patent: Dec. 24, 2024

(54) VOLTAGE APPLICATION DETERMINATION IN A PHOTOELECTRIC CONVERSION APPARATUS HAVING AVALANCHE PHOTODIODES AND PHOTOELECTRIC CONVERSION SYSTEM

(71) Applicant: CANON KABUSHIKI KAISHA, Tokyo (JP)

(72) Inventor: Kazuo Yamazaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 431 days.

(21) Appl. No.: 17/543,495

(22) Filed: Dec. 6, 2021

(65) Prior Publication Data
US 2022/0190011 A1  Jun. 16, 2022

(30) Foreign Application Priority Data
Dec. 10, 2020 (JP) .................. 2020-205112

(51) Int. Cl.
*H01L 27/146* (2006.01)
*H01L 27/144* (2006.01)
*H01L 31/107* (2006.01)

(52) U.S. Cl.
CPC .... *H01L 27/14609* (2013.01); *H01L 27/1443* (2013.01); *H01L 27/14627* (2013.01); *H01L 31/107* (2013.01)

(58) Field of Classification Search
CPC ........... H01L 27/14609; H01L 27/1443; H01L 27/14627; H01L 31/107; H01L 31/02027
USPC .......................................... 250/208.1, 214 R
See application file for complete search history.

(56) References Cited

U.S. PATENT DOCUMENTS

| | | |
|---|---|---|
| 11,309,440 B2 | 4/2022 | Ota |
| 2011/0050969 A1 | 3/2011 | Nishihara |
| 2013/0248689 A1 | 9/2013 | Eldesouki |
| 2015/0115131 A1 | 4/2015 | Webster |
| 2016/0020235 A1 | 1/2016 | Yamashita |
| 2017/0186798 A1 | 6/2017 | Yang |
| 2017/0221947 A1 | 8/2017 | Shishido |
| 2018/0115730 A1* | 4/2018 | Velichko ............. H04N 25/771 |
| 2018/0270405 A1* | 9/2018 | Ota ....................... H04N 25/778 |
| 2019/0068908 A1 | 2/2019 | Kobayashi |
| 2019/0189827 A1 | 6/2019 | Haraguchi |

(Continued)

FOREIGN PATENT DOCUMENTS

| | | |
|---|---|---|
| CN | 114450565 A * | 5/2022 |
| JP | 2018-81945 A1 | 5/2018 |

(Continued)

*Primary Examiner* — Thanh Luu
*Assistant Examiner* — Mai Thi Ngoc Tran
(74) *Attorney, Agent, or Firm* — Canon U.S.A., Inc., IP Division

(57) ABSTRACT

A photoelectric conversion apparatus includes a plurality of pixels each including a first avalanche photodiode and a second avalanche photodiode having a light-receiving surface area size different from a light-receiving surface area size of the first avalanche photodiode. The first avalanche photodiode is connected between a first waveform shaping circuit and a first switch. The second avalanche photodiode is connected between a second waveform shaping circuit and a second switch. An inverter circuit is connected between a control node of the first switch and a control node of the second switch.

15 Claims, 12 Drawing Sheets

(56) References Cited

U.S. PATENT DOCUMENTS

| | | | |
|---|---|---|---|
| 2019/0252442 A1 | 8/2019 | Tanaka | |
| 2019/0305146 A1* | 10/2019 | Kuroda | H01L 31/107 |
| 2020/0021767 A1 | 1/2020 | Ikeda | |
| 2020/0033482 A1 | 1/2020 | Negishi | |
| 2020/0045251 A1 | 2/2020 | Koizumi | |
| 2020/0304736 A1 | 9/2020 | Shinohara | |
| 2020/0314375 A1 | 10/2020 | Nishina | |
| 2021/0066909 A1* | 3/2021 | Ramadass | H01L 23/5256 |

FOREIGN PATENT DOCUMENTS

| | | |
|---|---|---|
| JP | 2018512573 A | 5/2018 |
| JP | 2018-157387 A | 10/2018 |
| JP | 2019107823 A | 7/2019 |
| JP | 2019140137 A | 8/2019 |
| WO | 2018/186195 A1 | 10/2018 |

* cited by examiner

PLAN VIEW

CROSS-SECTIONAL VIEW

VOLTAGE APPLICATION DETERMINATION IN A PHOTOELECTRIC CONVERSION APPARATUS HAVING AVALANCHE PHOTODIODES AND PHOTOELECTRIC CONVERSION SYSTEM

BACKGROUND

Technical Field

The present disclosure relates to a photoelectric conversion apparatus having avalanche photodiodes, a photoelectric conversion system, and a moving body.

Description of the Related Art

In recent years, the expansion of application fields of semiconductor apparatuses capable of detecting weak light at a single photon level has been expected. In particular, a technique called photon counting has attracted attention. In photon counting, luminance of incident light, which has conventionally been handled as a continuous value, is counted as a discrete value, i.e., the number of photons.

An avalanche photodiode (hereinafter also referred to as an APD) is one of examples of light detecting elements that perform photon counting in semiconductor apparatuses. Using the avalanche multiplication phenomenon generated by an intense electric field induced in a PN junction of a semiconductor, the APD amplifies the amount of signal electric charges excited by photons, several times to around a million times. By using the high-gain characteristics of the avalanche multiplication phenomenon, the APD makes it possible to largely amplify a weak light signal to improve the signal-to-noise (S/N) ratio in readout noise occurring in a readout circuit. Thus, a luminance resolution at a single photon level can be achieved.

As an example of a semiconductor apparatus, Japanese Patent Application Laid-Open No. 2018-157387 discusses an imaging apparatus having a plurality of pixels each of which includes a plurality of single photon avalanche diodes (SPADs). Japanese Patent Application Laid-Open No. 2018-157387 discusses a method for improving the degree of freedom of a photoelectric conversion gain setting by changing the number of avalanche diodes to be set in the active state among avalanche diodes included in each pixel, according to the luminance of a subject.

However, in the apparatus discussed in Japanese Patent Application Laid-Open No. 2018-157387, since each of the avalanche diodes in each pixel needs to be independently controlled, there arises an issue of an increase in the circuit area due to signal lines necessary for the control.

There also arises an issue of an increase in power consumption required for photon counting due to increases in the number of signal lines and the total count value of counters.

SUMMARY

The present disclosure has been embodied in view of the above-described issues, and is directed to reducing a circuit area and power consumption of a photoelectric conversion apparatus using avalanche diodes.

According to an aspect of the present disclosure, a photoelectric conversion apparatus includes a plurality of pixels each including a first avalanche photodiode and a second avalanche photodiode having a light-receiving surface area size different from a light-receiving surface area size of the first avalanche photodiode The first avalanche photodiode is connected between a first waveform shaping circuit and a first switch. The second avalanche photodiode is connected between a second waveform shaping circuit and a second switch. An inverter circuit is connected between a control node of the first switch and a control node of the second switch.

According to another aspect of the present disclosure, a photoelectric conversion apparatus includes a plurality of pixels each including a first avalanche photodiode and a second avalanche photodiode having a light-receiving surface area size different from a light receiving surface area size of the first avalanche photodiode. The apparatus includes a control circuit configured to not apply, in a case where either one of the first avalanche photodiode and the second avalanche photodiode is applied with a reverse bias voltage equal to or higher than a breakdown voltage, the reverse bias voltage equal to or higher than the breakdown voltage to the other one of the first avalanche photodiode and the second avalanche photodiode. In some pixels of the plurality of pixels, the first avalanche photodiode is applied with the reverse bias voltage equal to or higher than the breakdown voltage. In other some pixels of the plurality of pixels, the second avalanche photodiode is applied with the reverse bias voltage equal to or higher than the breakdown voltage.

Further features of the disclosure will become apparent from the following description of exemplary embodiments with reference to the attached drawings.

DESCRIPTION OF THE EMBODIMENTS

A photoelectric conversion apparatus and a method for driving a photoelectric conversion apparatus according to a first exemplary embodiment of the present disclosure will be described below with reference to FIGS. 1 to 6.

Figure 1:
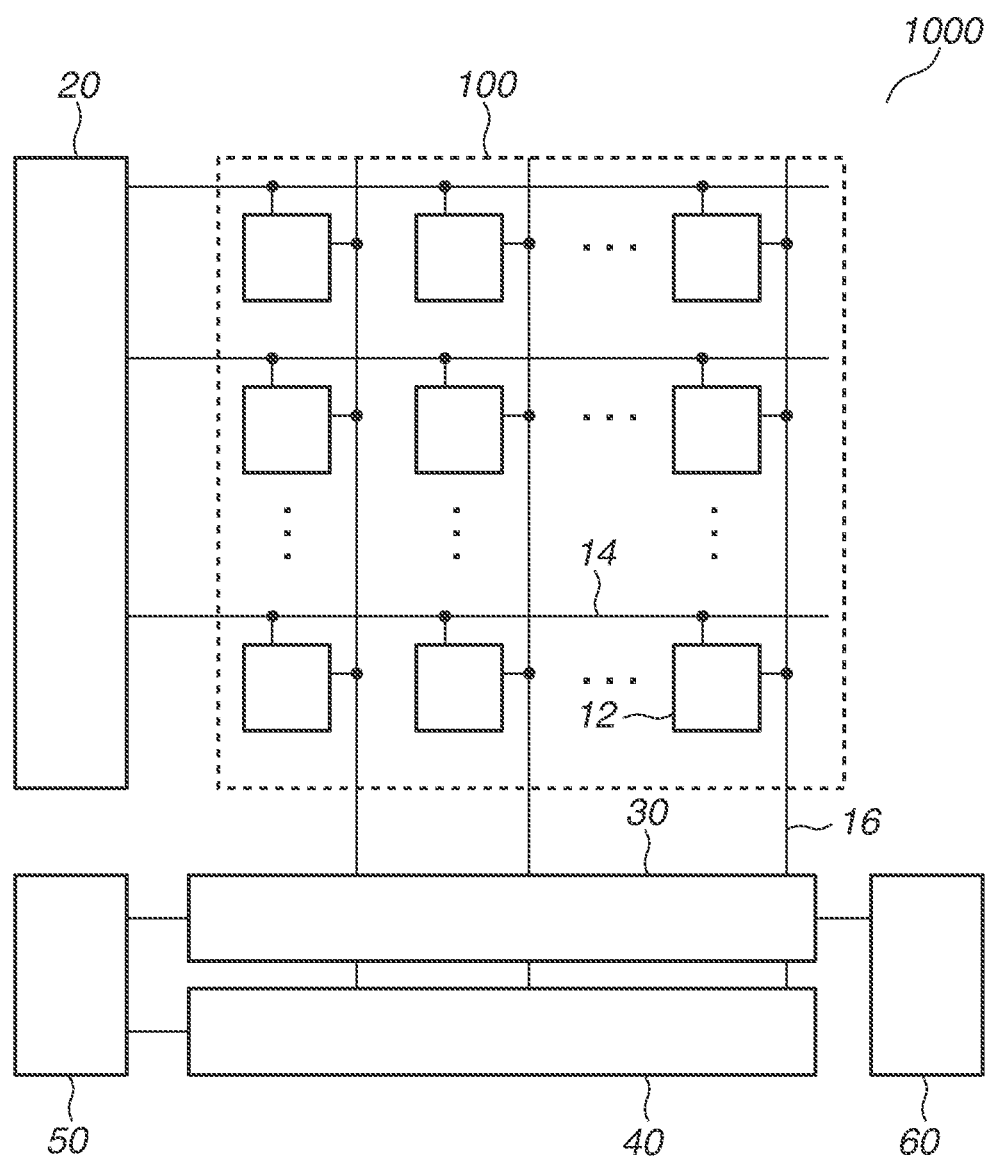
FIG. 1 is a schematic view illustrating a photoelectric conversion apparatus according to a first exemplary embodiment.
Figure 2:
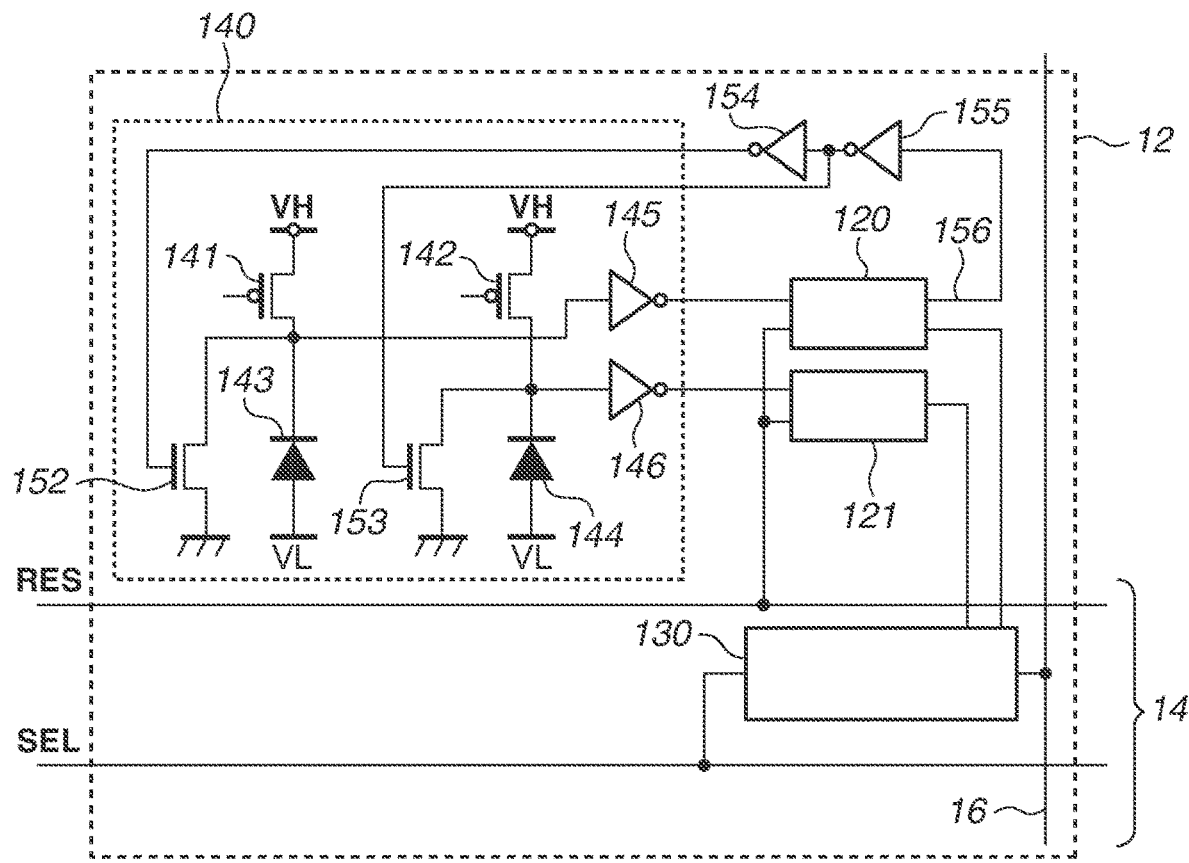
FIG. 2 is a diagram illustrating an example configuration of a pixel circuit of the photoelectric conversion apparatus according to the first exemplary embodiment.
Figure 3A:
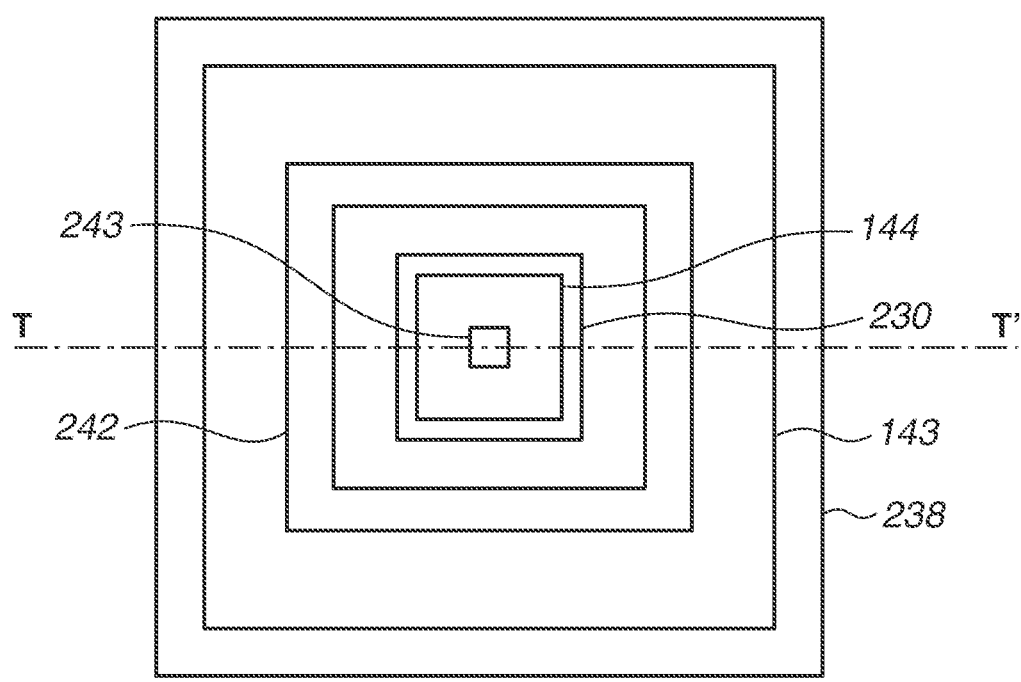
FIGS. 3A and 3B are a plan view and a cross-sectional view, respectively, illustrating an example configuration of avalanche photodiodes (APDs) of a pixel of the photoelectric conversion apparatus according to the first exemplary embodiment.
Figure 3B:
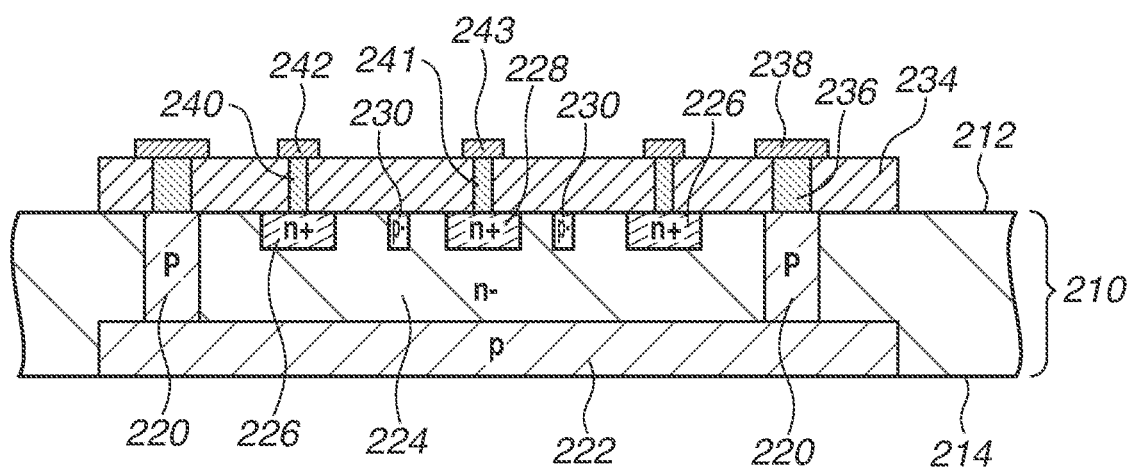
Figure 4:
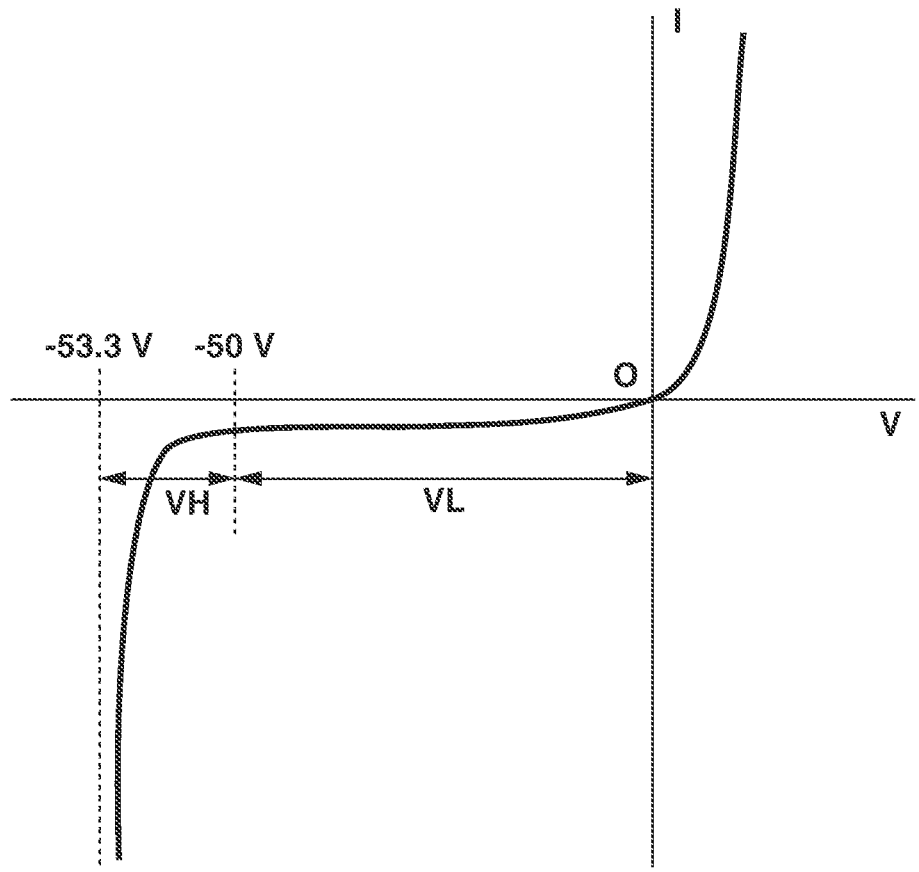
FIG. 4 is a graph illustrating an example of a current-voltage characteristic of an APD.
Figure 5:
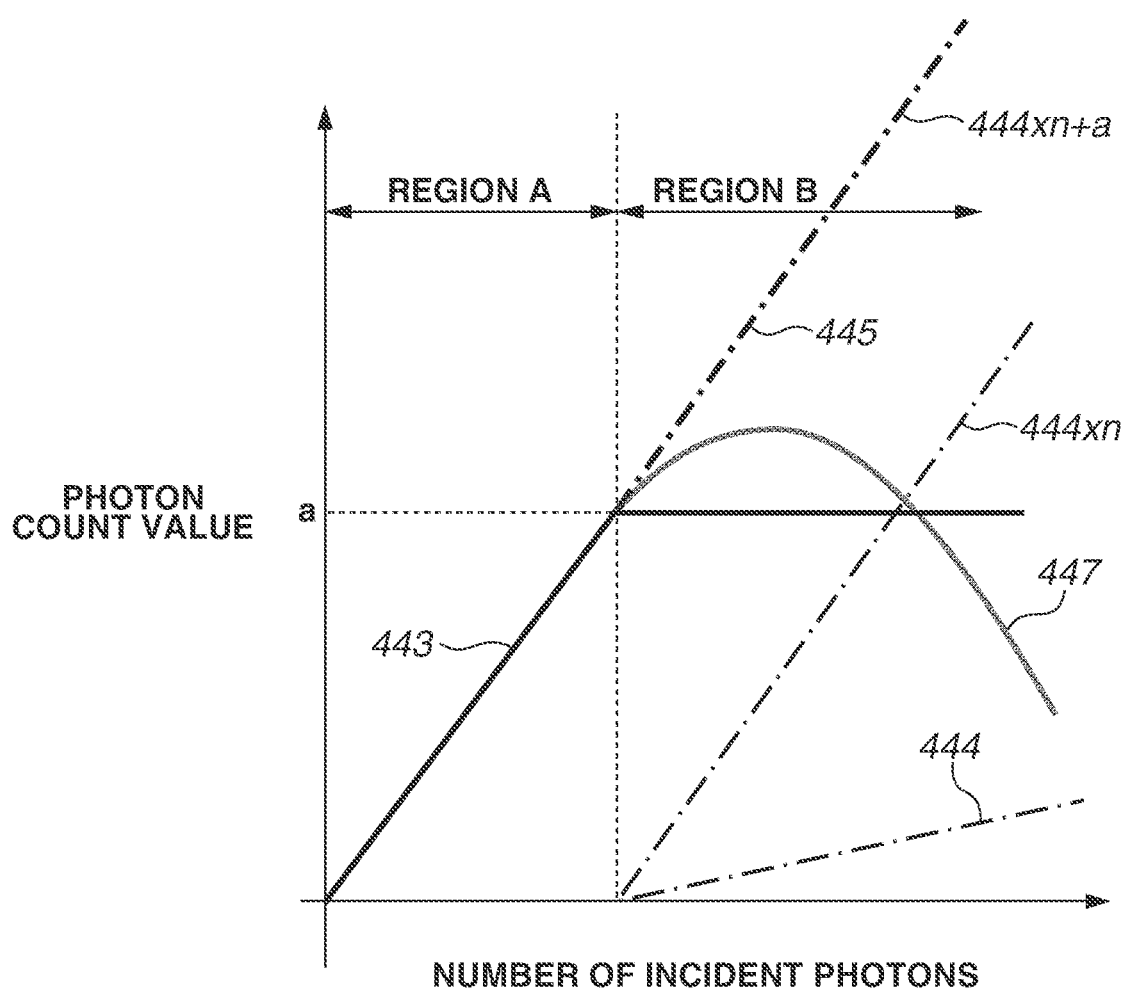
FIG. 5 is a graph illustrating a relation between the number of incident photons and the number of counted photons.
Figure 6:
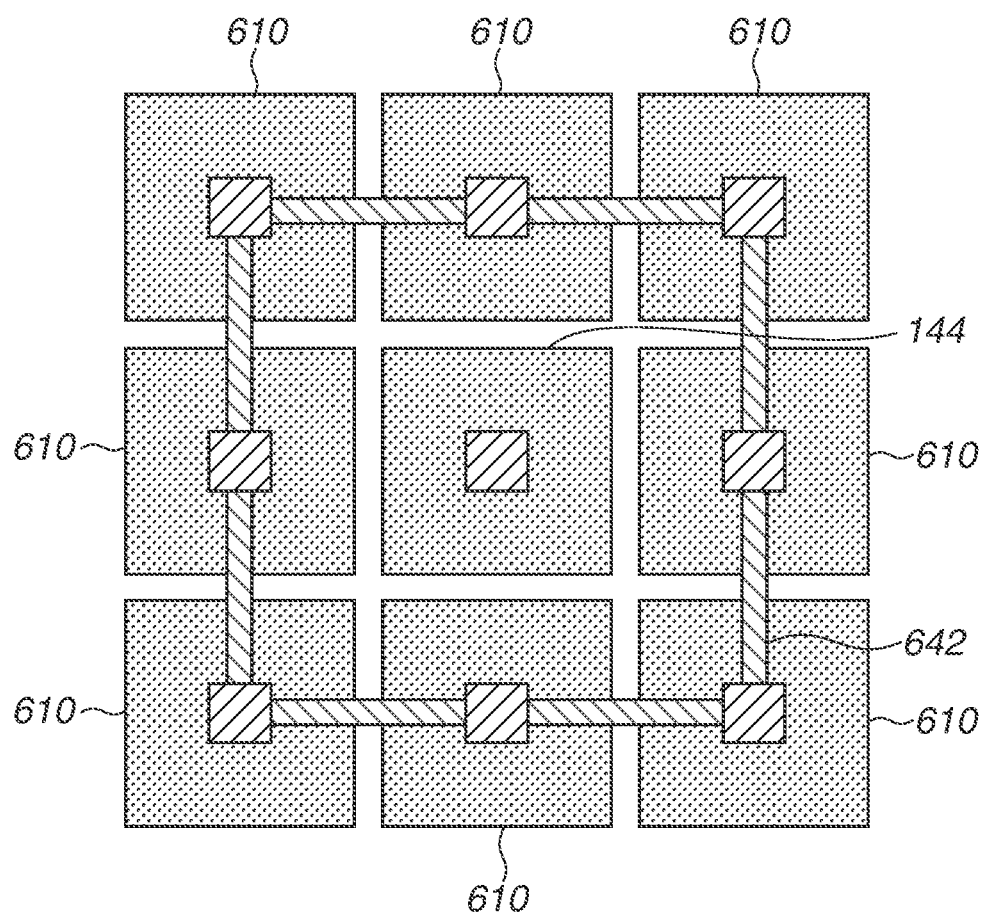
FIG. 6 is a diagram illustrating another example configuration of APDs of a pixel of the photoelectric conversion apparatus according to the first exemplary embodiment.

FIG. 1 is a schematic view illustrating the photoelectric conversion apparatus according to the present exemplary embodiment. FIG. 2 illustrates an example configuration of a pixel circuit of the photoelectric conversion apparatus according to the present exemplary embodiment. FIGS. 3A and 3B are a plan view and a cross-sectional view, respectively, illustrating an example configuration of avalanche photodiodes (APDs) of a pixel of the photoelectric conversion apparatus according to the present exemplary embodiment. FIG. 4 is a graph illustrating an example of a current-voltage characteristic of an APD. FIG. 5 is a graph illustrating the relation between the number of incident photons and the number of counted photons (hereinafter referred to as a photon count value) according to the present exemplary embodiment. FIG. 6 illustrates an example configuration of the pixel circuit of the photoelectric conversion apparatus according to the present exemplary embodiment.

Overall Configuration of Photoelectric Conversion Apparatus

As illustrated in FIG. 1, a photoelectric conversion apparatus 1000 according to the present exemplary embodiment includes a pixel region 100, a vertical scanning circuit 20, a column readout circuit 30, a horizontal scanning circuit 40, a control circuit 50, and a signal processing circuit 60.

The pixel region 100 includes a plurality of pixels 12 arranged in a plurality of rows and a plurality of columns in a matrix form. Each row of the pixel array in the pixel region 100 is provided with a control signal line 14 that extends in a row direction (horizontal direction in FIG. 1). The control signal lines 14 are connected to the pixels 12 arranged in the row direction as common signal lines for the pixels 12. Each column of the pixel array in the pixel region 100 is provided with a vertical output line 16 that extends in a column direction (vertical direction in FIG. 1). The vertical output lines 16 are connected to the pixels 12 arranged in the column direction as common signal lines for the pixels 12. While, in FIG. 1, one vertical output line 16 is drawn, a plurality of vertical output lines 16 in accordance with the number of bits of the output signal may be connected to the pixels 12.

The number of pixels 12 included in the pixel region 100 is not particularly limited. For example, the pixel region 100 may include the pixels 12 in several thousands of rows by several thousands of columns, like a common digital camera, or include a plurality of the pixels 12 arranged in one row or one column. Alternatively, the pixel region 100 may include one pixel 12.

The control signal line 14 in each row is connected to the vertical scanning circuit 20. The vertical scanning circuit 20 is a circuit unit that supplies a control signal for driving a readout circuit in the pixels 12 when pixel signals are read out from the pixels 12, to the pixels 12 via the control signal lines 14.

One end of the vertical output line 16 in each column is connected to the column readout circuit 30. The pixel signals read out from the pixels 12 are input to the column readout circuit 30 via the vertical output lines 16. The column readout circuit 30 can include a memory for holding the pixel signals read out from the pixels 12.

The horizontal scanning circuit 40 is a circuit unit that supplies, to the column readout circuit 30, control signals for sequentially transferring the pixel signals held by the column readout circuit 30 to the signal processing circuit 60 for each column. The control circuit 50 is a circuit unit that supplies control signals for controlling operations and timings of the vertical scanning circuit 20, the column readout circuit 30, and the horizontal scanning circuit 40. The signal processing circuit 60 processes the pixel signals.

Pixel Configuration

A configuration and a connection relation of a pixel 12 according to the present exemplary embodiment will be described below. FIG. 2 is a block diagram or an equivalent circuit diagram illustrating an overall configuration of the pixel 12. As illustrated in FIG. 2, each of the pixels 12 includes a photoelectric conversion portion 140, counter circuits 120 and 121, a selection circuit 130, and inverter circuits 154 and 155.

The photoelectric conversion portion 140 includes avalanche photodiodes (hereinafter also referred to as APDs) 143 and 144. Anodes of the APDs 143 and 144 are connected to a power source that supplies a voltage VL. A cathode of the APD 143 is connected to input terminals of a P-type metal oxide semiconductor (MOS) transistor 141 and an inverter circuit 145. A cathode of the APD 144 is connected to input terminals of a P-type MOS transistor 142 and an inverter circuit 146. The P-type MOS transistors 141 and 142 are connected to a power source that supplies a voltage VH that is higher than the voltage VL. A gate of an NMOS transistor 152 is connected to an output terminal of the inverter circuit 154. The NMOS transistor 152 is further connected to the ground potential as a reference voltage source and the cathode of the APD 143. A gate of an NMOS transistor 153 is connected to an output terminal of the inverter circuit 155. The NMOS transistor 153 is further connected to the ground potential and the cathode of the APD 144.

Output terminals of the inverter circuits 145 and 146 serve as output nodes of the photoelectric conversion portion 140. The output terminals of the inverter circuits 145 and 146 are connected to the counter circuits 120 and 121, respectively. Output of the counter circuit 120 is partially input to the inverter circuit 155 via a wiring 156, and output of the inverter circuit 155 is input to the inverter circuit 154. The counter circuits 120 and 121 are connected to the vertical output line 16 via the selection circuit 130.

"Connection" is not limited to a case where each element is directly connected. Unless otherwise noted, the term "connection" in the present specification may also indicate a state where resistors, capacitors, and other elements and members are disposed on an electrical path that connects elements subjected to the "connection". More specifically, a state where the electrical paths for elements are continuous is included in the category of "connection".

Function of Each Element of Pixel

A function of each element of a pixel will be described below.

The photoelectric conversion portion 140 photoelectrically converts incident light on the APDs 143 and 144, and generated electric charges cause the avalanche multiplication. Thus, a voltage exceeding the reverse breakdown voltage is applied to the APDs 143 and 144. Since a quenching resistor (described below) is connected to each of the APDs 143 and 144, cathode voltages of the APDs 143 and 144 are changed by occurrence of the avalanche multiplication.

In the example configuration illustrated in FIG. 2, the APD 143 has a larger area of a light receiving surface in the photoelectric conversion portion 140 and provides a higher photosensitivity than the APD 144. In a case where a micro lens for guiding incident light to the light receiving surface is disposed on the photoelectric conversion portion 140, one micro lens is disposed to cover both the APDs 143 and 144. Thus, when one micro lens is projected to the light receiving surface, projection of the micro lens at least partially overlaps with the light receiving surfaces of the APDs 143 and 144.

The P-type MOS transistors 141 and 142 function as quenching resistors when the APDs 143 and 144 are operated in a Geiger mode. With these resistors, voltages of cathodes of the APDs 143 and 144 are temporarily changed by occurrence of the avalanche multiplication, and then returns to the original voltage (typically the voltage VH). This is because a suitable impedance occurs between a node of the power source and the cathodes. When the quenching resistors are connected in this way, a voltage change occurs the number of times corresponding to the number of incident photons.

Each of the inverter circuits 145 and 146 determines whether a signal input from the APDs 143 and 144, respectively, exceeds a threshold value, and outputs a signal that is an inversion of a magnitude relation between the input signal and the threshold value. An input terminal of the inverter circuit 145 is connected to the cathode of the APD 143. An input terminal of the inverter circuit 146 is connected to the cathode of the APD 144. Each of the inverter circuits 145 and 146 outputs a pulse wave having a shaped voltage change of the cathodes of the APDs 143 and 144, respectively. More specifically, each of the inverter circuits 145 and 146 functions as a waveform shaping circuit that shapes a continuous signal output from the corresponding APD in a pulse form and outputs the pulse wave.

As described above, a voltage change occurs at the cathodes of the APDs 143 and 144 each time a photon is incident. Thus, each of the inverter circuits 145 and 146 outputs the number of pulse waves corresponding to the number of incident photons, whereby photon counting can be performed.

Each of the counter circuits 120 and 121 counts the number of pulses output from the corresponding inverter circuit to count the number of photons incident on the corresponding APD. For example, a 3-bit counter circuit can count up the third power of 2 in decimal. For example, the counter circuit obtains a count value from 0 to 7. In a case where the count value reaches the maximum value of a counter circuit, the counter circuit overflows, which makes it impossible to obtain the count value exceeding the maximum value of the counter circuit. Since the counter circuit restarts counting from the initial value or an indefinite value, an obtained count value does not coincide with the actual number of incident photons. When the counter circuit is reset, the counter circuit restarts counting from the initial value.

The selection circuit 130 is connected to the vertical scanning circuit 20 via the control signal lines 14. Upon reception of a control signal supplied from the control circuit 50, the selection circuit 130 selects a readout of the count value of the counter circuit 120 or 121 to the vertical output line 16. The selected signal is output to the vertical output line 16 as a signal of a pixel subjected to signal readout among the plurality of the pixels 12 in the pixel region 100.

The inverter circuit 155 is connected to the counter circuit 120 via the wiring 156. The count value of the counter circuit 120 is partially input to the inverter circuit 155. The output terminal of the inverter circuit 155 is further connected to an input terminal of the inverter circuit 154. Since an inverter circuit inverts an input signal and outputs an inverted signal, outputs of the inverter circuits 154 and 155 have an exclusive signal relation. The output of the inverter circuit 154 is input to a gate of the NMOS transistor 152, and the output of the inverter circuit 155 is input to a gate of the NMOS transistor 153.

The NMOS transistor 152 functions as a switch that determines whether to apply a reverse bias voltage to the APD 143, based on the output of the inverter circuit 154. Likewise, the NMOS transistor 153 functions as a switch that determines whether to apply a reverse bias voltage to the APD 144, based on the output of the inverter circuit 155. Since the outputs of the inverter circuits 154 and 155 have an exclusive signal relation, the ON/OFF states of the NMOS transistors 152 and 153 also have an exclusive signal relation.

The control signal lines 14 include a reset signal line RES and a selection signal line SEL. The reset signal line RES is connected to the counter circuits 120 and 121 of the pixel 12 belonging to the corresponding row, and supplies a reset signal for resetting the counts of the counter circuits 120 and 121. The selection signal line SEL is connected to the selection circuit 130 of the pixel 12 belonging to the corresponding row, and supplies to the selection circuit 130 a signal for controlling signal readout from each pixel to the vertical output line 16.

Configuration of Avalanche Photodiodes

A structure of the APDs 143 and 144 will be described below with reference to FIGS. 3A and 3B. The photoelectric conversion apparatus according to the present exemplary embodiment can be configured, for example, by laminating a first substrate on which the APDs 143 and 144 are disposed and a second substrate on which other components are disposed. Other components may include the vertical scanning circuit 20, the column readout circuit 30, the horizontal scanning circuit 40, the control circuit 50, the signal processing circuit 60, and other peripheral circuits in addition to the components of the pixel 12 other than the APDs 143 and 144. FIG. 3B schematically illustrates the cross-section taken along the line T-T' (FIG. 3A) on the substrate on which APDs are disposed, among the two substrates. The photoelectric conversion apparatus according to the present exemplary embodiment is not limited to the configuration illustrated in FIG. 3B. For example, some of the pixels 12 are disposed on the first substrate and other pixels 12 are disposed on the second substrate to implement a lamination structure.

Both the APDs 143 and 144 of each pixel 12 are formed on a semiconductor substrate 210. The semiconductor substrate 210 is, for example, an N-type silicon substrate, and includes a first surface 212 and a second surface 214 facing the first surface 212. For example, the first surface 212 is a front surface of the semiconductor substrate 210, and the second surface 214 is a rear surface of the semiconductor substrate 210.

The semiconductor substrate 210 is provided with an N-type semiconductor region 224. The N-type semiconductor region 224 is partitioned into regions each corresponding to one pixel 12 by a separation region including a P-type semiconductor region 220. The P-type semiconductor region 220 is disposed to surround each N-type semiconductor region 224 in a planar view. A side of the second surface 214 of the P-type semiconductor region 220 is in contact with a P-type semiconductor region 222 disposed in contact with the second surface 214 of the semiconductor substrate 210.

Among the P-type and the N-type semiconductor regions configuring the APDs 143 and 144 included in one pixel 12, the N-type semiconductor region is surrounded by the P-type semiconductor region 220 and the P-type semiconductor region 222. The N-type semiconductor region includes one N-type semiconductor region 224 partitioned by the P-type semiconductor region 220, and N-type semiconductor regions 226 and 228 disposed in the N-type semiconductor region 224.

While, in this example, the N-type semiconductor region 224 where a plurality of APDs for each pixel 12 is disposed is separated by a PN junction, the N-type semiconductor region 224 may be separated by other element separation methods. Examples of other element separation methods include the Shallow Trench Isolation (STI) method, the Deep Trench Isolation (DTI) method, and the LOCal Oxidation of Silicon (LOCOS) method.

Each N-type semiconductor region 224 partitioned by the P-type semiconductor region 220 as a separation region configures the plurality of the APDs 143 and 144 included in one pixel 12. Referring to FIG. 3A, the white space for separating the APDs 143 and 144 disposed in the N-type semiconductor region 224 corresponds to a P-type semiconductor region 230 illustrated in FIG. 3B.

The region in the N-type semiconductor region 224 in the proximity of the P-type semiconductor regions 220 and 222 serves as the cathode of the APD 143, and the P-type semiconductor regions 220 and 222 in contact with the N-type semiconductor region 224 serve as the anode of the APD 143. The N-type semiconductor region 226 is a part of the cathode of the APD 143. The center of the N-type semiconductor region 224 serves as the cathode of the APD 144 and the P-type semiconductor regions 220 and 222 serve as the anode of the APD 144. The N-type semiconductor region 228 serves as a part of the cathode of the APD 144. The N-type semiconductor regions 226 and 228 are disposed in contact with the first surface 212 of the semiconductor substrate 210. The APDs 143 and 144 are separated from elements outside the pixel 12 by the P-type semiconductor region 220. The APDs 143 and 144 include the P-type semiconductor regions 220 and 222 as a common anode. The cathodes of the APDs 143 and 144 are electrically separated by the P-type semiconductor region 230. The P-type semiconductor region 230 is disposed between the N-type semiconductor regions 228 and 226 of the adjacent APDs 143 and 144, in contact with the first surface 212 of the semiconductor substrate 210.

An insulating film 234 is disposed on the first surface 212 of the semiconductor substrate 210 on which the APDs 143 and 144 are disposed. Wirings 238, 242, and 243 are disposed on the insulating film 234. The wiring 238 is connected to the P-type semiconductor region 220 via a contact plug 236. The wiring 242 is connected to the N-type semiconductor region 226 via a contact plug 240. The wiring 243 is connected to the N-type semiconductor region 228 via a contact plug 241.

The P-type semiconductor region 220 as the anode is supplied with the voltage VL via the wiring 238 and the contact plug 236. The N-type semiconductor region 226 as the cathode is connected to the inverter circuit 145 illustrated in FIG. 2 via the contact plug 240 and the wiring 242. The N-type semiconductor region 228 is connected to the inverter circuit 146 via the contact plug 241 and the wiring 243.

Referring to the APD 143 as an example, since a reverse bias voltage is applied between the P-type semiconductor region 220 and the N-type semiconductor region 226, a depletion layer is formed on a PN junction surface between the P-type semiconductor regions 220 and 222 and the N-type semiconductor region 224. When light is incident from the second surface 214 of the P-type semiconductor region 222, pairs of an electron and a hole are formed in a semiconductor region of an incidence portion. Generated electrons are accelerated by the electric field directing from the P-type semiconductor region 222 to the N-type semiconductor region 226, and the avalanche multiplication occurs.

An impurity density of the N-type semiconductor region 226 is higher than an impurity density of the N-type semiconductor region 224. Further, a potential barrier due to the P-type semiconductor region 230 is formed around the N-type semiconductor region 226. Thus, electric charges generated by the avalanche multiplication are gathered in the N-type semiconductor region 226 corresponding to the generation position.

The avalanche multiplication also occurs in the APD 144 in a similar way. Electric charges generated by the avalanche multiplication are gathered in the N-type semiconductor region 228. Sufficiently increasing impurity densities of the N-type semiconductor regions 226 and 228 makes it possible to gradually form a potential valley from the PN junction where the avalanche multiplication occurs, and gather electric charges in the N-type semiconductor regions 226 and 228.

Impurity densities of the P-type semiconductor regions 220 and 222 are higher than an impurity density of the P-type semiconductor region 230, and form an electric field that is sufficient to cause the avalanche multiplication between the N-type semiconductor region 224 and the P-type semiconductor regions 220 and 222. The semiconductor substrate 210 may be a P-type silicon substrate, and the N-type semiconductor region 224 in FIG. 3B may be a P-type semiconductor region having a lower impurity density than the P-type semiconductor regions 220 and 222. In this case, the avalanche multiplication occurs by the electric field formed between the P-type semiconductor region and the N-type semiconductor region 226. The field intensity can be improved by replacing the N-type semiconductor region 224 with the P-type semiconductor region having a lower impurity density than the P-type semiconductor region 220. As a result, the avalanche multiplication can be generated at a lower voltage. In such a configuration, noise can be effectively reduced by providing a guard region that prevents a concentrated occurrence of the avalanche multiplication at the edge of the N-type semiconductor region 226.

In the example configuration of a pixel illustrated in FIG. 3A, the APD 143 having a small area and a low sensitivity is disposed at the center, and the APD 144 having a large area and a high sensitivity is disposed in the outer periphery, among the APDs included in one pixel 12. However, an example configuration of a pixel is not limited thereto.

As other example configurations, light collection efficiency of the micro lens disposed on the pixel may be utilized. For example, in a case where one pixel 12 includes APDs having the same area, a similar effect can be obtained by disposing a high-sensitivity APD under the center of the micro lens and disposing a low-sensitivity APD under the outer periphery of the micro lens.

Operation of APD

The operation of an APD in the Geiger mode will be described below.

A description will be given of an example case where as for the voltages VH and VL, the APDs 143 and 144 have current/voltage characteristics illustrated in FIG. 4, for example, when operating in the Geiger mode. A reverse breakdown voltage (hereinafter also simply referred to as a breakdown voltage) of the APD illustrated in FIG. 4 has a value between −50 V and −53.3 V. More specifically, even in a case where a reverse bias voltage up to around −50 V is applied to the APD, the avalanche multiplication does not occur. However, in a case where a reverse bias voltage higher than the breakdown voltage is applied to the APD, the avalanche multiplication occurs. In a case where a reverse bias voltage around −53.3 V or higher is applied to the APD, the APD operates in what is called the Geiger mode in which a gain of the avalanche multiplication is very high.

According to the present exemplary embodiment, the APD is used as a single photon avalanche diode (SPAD) that operates in the Geiger mode. Thus, for example, −50 V is applied to the anode of the APD as the voltage VL, and +3.3 V is applied to the P-type MOS transistor as the voltage VH. As a result, a reverse bias voltage of approximately 53.3 V is applied to each of the APDs 143 and 144.

Gates of the P-type MOS transistors 141 and 142 as quenching resistors are applied with the same voltage as the voltage applied to the sources thereof. Thus, the P-type MOS transistors 141 and 142 operate as resistive elements with which a resistance value is determined by a transistor size. The two transistors can also be used as resistive elements having a higher resistance value by setting a voltage to be applied to the gates of the P-type MOS transistors 141 and 142 to be lower than the voltage applied to the sources thereof. Gate voltages of the P-type MOS transistors 141 and 142 can be appropriately set to obtain desired quenching resistors.

The APD is applied with a reverse bias voltage of 53.3 V that is a potential difference between the voltages VH and VL. This reverse bias voltage is higher than the breakdown voltage and is sufficient to cause the avalanche multiplication. However, in a state where there is no seed carrier, the avalanche multiplication does not occur and no current flows in the APD.

When photons are incident from the side of the second surface 214 of the semiconductor substrate 210 in this state, photons are absorbed in the N-type semiconductor region 224, and pairs of an electron and a hole are generated. Among these carriers, holes are discharged via the P-type semiconductor regions 220, 222, and 230. On the other hand, electrons are accelerated by an electric field of the N-type semiconductor region 226 or 228 to cause the avalanche multiplication, and the APD operates in the Geiger mode.

Focusing on actions of the carriers, when the avalanche multiplication occurs and a large current flows in the APD, a potential of a node on the cathode side of the APD decreases and the avalanche multiplication stops. The carriers of the node on the cathode side are discharged via the P-type MOS transistors 141 and 142 connected as loads, and the node on the cathode side returns to the initial voltage (quenching operation).

Thus, with an incidence of photons, the potential of the cathode of the APD changes from a carrier standby state to a state where a voltage drop has occurred by a large current flow in the Geiger mode, and then returns to the carrier standby state. The inverter circuits 145 and 146 shape this voltage waveform to generate a pulse signal starting from the point in time when one photon arrives. Counting the number of pulses of this signal enables performing what is called photon counting.

Pileup Phenomenon

In the above-described photon counting, in a case where a small number of photons are incident, a high linearity can be obtained between the numbers of incident photons of the APDs 143 and 144 and the count values of the counter circuits 120 and 121.

However, in a case where a large number of photons are incident, the photon count value of the counter circuit 120 may be smaller than the number of incident photons. This is because, in a case where light is intense and a remarkably large number of photons are incident, photon counting by the counter circuit 120 fails, and the photon count value may become approximately zero.

On the other hand, the APD 144 has a lower sensitivity than the APD 143 as described above. Thus, even in a case where the incident light is so intense that photon counting by the counter circuit 120 fails, accurate photon counting can be performed by the counter circuit 121.

The cause of such a phenomenon will be described below. In a case where a relatively small number of photons are incident, the probability of overlapped timing of photon detection in the APDs 143 and 144 is very low. In the inverter circuits 145 and 146, the pulse signal rises and then falls before the following photon comes, which makes it possible to output the number of signal pulses equivalent to the number of photons incident on the corresponding APD.

On the other hand, in a case where a large number of photons are incident, there is a high probability that a photon is incident again on the APD 143 after the signal pulse rises and before the signal pulse falls in the inverter circuit 145. In response to new photons being incident, the avalanche current increases. As a result, the voltage of the cathode of the APD 143, i.e., the voltage of the input node of the inverter circuit 145, becomes hard to return to the previous voltage. This poses a pileup phenomenon in which a plurality of signal pulses is concatenated, possibly preventing new incident photons from being counted. Further, in a case where a remarkably large number of photons are incident, the output of the inverter circuit 145 set to the High level remains unchanged. As a result, the counter circuit 120 becomes unable to count signal pulses, which reduces the accuracy of photon counting.

As described above, in photon counting, a frequency of detectable photon arrival, i.e., light intensity, is determined by the time period since when one photon is detected until when the following photon becomes detectable (this time period is referred to as a "dead time"). The length of the dead time depends on impedances of the quenching resistors (P-type MOS transistors 141 and 142) and parasitic capacitances of the cathodes of the APDs 143 and 144.

To implement a super high-sensitivity photoelectric conversion apparatus capable of detecting photons even in a very dark state, such as under the moonlight and starlight, the pixel 12 having a large size to a certain extent may be disposed. However, in a bright state such as under light in the daytime, a photoelectric conversion apparatus configured in this way provides an excessively high frequency of photon detection even with a light quantity reduced by a diaphragm mechanism, which reduces the accuracy of photon counting.

Expansion of Dynamic Range

According to the present exemplary embodiment, the APD 144 has a smaller area and a lower sensitivity than the APD 143. Thus, in a state where comparatively weak light is incident, a count value 443 of the APD 143 becomes a small count value. Even in a state where comparatively intense light is incident and the count value corresponding to the APD 143 decreases, the photon count value of the APD 144 keeps linearly increasing with respect to the number of incident photons as long as the frequency of photons incident on the APD 144 does not overlap with the dead time.

Thus, in a case where a small number of photons are incident and hence the linearity of the outputs of both the APDs 144 and 143 can be maintained, high-sensitivity light detection can be performed by the APD 143. On the other hand, in a case where a large number of photons are incident and hence the linearity of the output of the APD 143 may degrade, light detection can be performed by the APD 144 that can maintain the linearity of the output. Using different APDs for light detection according to the light intensity in this way enables expanding a dynamic range of the entire pixel.

However, in a case of enabling each of a plurality of APDs in a pixel to perform photon counting for the purpose of using different APDs for light detection according to the light intensity in this way, a circuit for controlling operation of each APD is required. This results in an increase in the circuit area, and the power consumption is also increased.

Example of Operation

A method for solving the issue according to the present exemplary embodiment will be described below.

According to the present exemplary embodiment, the sensitivity ratio between the APDs 143 and 144 is set to be n. This means that, with the same light quantity in a region A, the count value corresponding to the APD 143 is n times the count value corresponding to the APD 144.

FIG. 5 is a graph illustrating a relation between the number of incident photons and the photon count value according to the present exemplary embodiment. The horizontal axis is assigned the number of incident photons in unit time and unit area, and the vertical axis is assigned the photon count value in the counter circuit 120. A plot of the count value 443 in FIG. 5 indicates the photon count value corresponding to the APD 143 in FIG. 2. A plot of the count value 444 in FIG. 5 indicates the photon count value corresponding to the APD 144 in FIG. 2. As illustrated in FIG. 5, in a case where a small number of photons are incident (region A), the APD 143 can accurately count the number of incident photons by using the counter circuit 120. Since the APD 144 stops counting in the region A, the plot of the count value 444 as the photon count value does not increase in the region A.

A plot of a count value 445 indicates the value obtained by multiplying the photon count value corresponding to the APD 144 in FIG. 2 by n and adding a threshold value a. The plot of the count value 445 indicates a relation between the number of incident photons in unit time and unit area after image processing and the photon count value after calculation processing according to the present exemplary embodiment.

In a case where light is incident on the APDs 143 and 144, the avalanche multiplication occurs in each APD. The outputs of the APDs 143 and 144 are shaped into pulse waves by the inverter circuits 145 and 146, respectively. The pulse wave output from the inverter circuit 145 is input to the counter circuit 120. The pulse wave output from the inverter circuit 146 is input to the counter circuit 121. Thus, the counter circuit 120 counts the total number of photons detected by the APD 143, and the counter circuit 121 counts the total number of photons detected by the APD 144.

The output of the counter circuit 120 is partially input to the wiring 156. The wiring 156 is connected to an input terminal of the inverter circuit 155. The output terminal of the inverter circuit 155 is connected to the input terminal of the inverter circuit 154.

The signal input to the gate of the NMOS transistor 152 via the inverter circuits 155 and 154, and the signal input to the gate of the NMOS transistor 153 have exclusive signal values.

For example, according to the present exemplary embodiment, in a case where a small number of photons are incident and the output of the counter circuit 120 is at the Low level, the input of the inverter circuit 155 is also at the Low level. Thus, the output of the inverter circuit 155 and the gate voltage of the NMOS transistor 153 become the High level, and the NMOS transistor 153 turns ON. On the other hand, the output of the inverter circuit 154 and the gate voltage of the NMOS transistor 152 become the Low level, and the NMOS transistor 152 turns OFF.

Since the NMOS transistor 153 is connected to the ground potential, in a case where the NMOS transistor 153 turns ON, the potential of the cathode (node N) of the APD 144 becomes 0 V and the reverse bias applied to the APD 144 becomes equal to or lower than the breakdown voltage. Even in a case where electrons are generated by photons in this state, the electrons are discharged via the P-type MOS transistor 142 without causing the avalanche multiplication. Since the current by elementary electric charges is very small, and the voltage drop by the P-type MOS transistor 142 is very small, no pulse signal exceeding the threshold value of the inverter circuit 145 is output.

More specifically, the NMOS transistor 153 functions as a switch for stopping the avalanche multiplication of the APD 144.

On the other hand, since the gate of the NMOS transistor 152 is at the Low level, the NMOS transistor 152 is OFF. As described above, the APD 143 operates in the Geiger mode to perform photon counting.

In a case where the output of the counter circuit 120 reaches the threshold value a, the wiring 156 changes from the Low to the High level. The gate voltage of the NMOS transistor 153 connected to the output terminal of the inverter circuit 155 becomes the Low level, and the NMOS transistor 153 turns OFF. On the other hand, the gate voltage of the NMOS transistor 152 connected to the output terminal of the inverter circuit 154 becomes the High level, and, the NMOS transistor 152 turns ON.

More specifically, in a case where the output of the counter circuit 120 reaches the threshold value a, the avalanche multiplication of the APD 143 stops. In a case where the photon count value reaches the threshold value a, the count value 443 becomes constant. On the other hand, the APD 144 starts the operation in the Geiger mode, and counting of the count value 444 starts.

In a case where the count value 443 does not exceed the threshold value a (in a case where the incident light quantity is within the range of the region A), only the APD 143 causes the avalanche multiplication. Meanwhile, the APD 144 causes neither the avalanche multiplication nor photon counting. On the other hand, in a case where the count value 443 exceeds the threshold value a (in a case where the incident light quantity is in a range of a region B), the APD 143 stops the avalanche multiplication and does not perform the photon counting. Only the APD 144 causes the avalanche multiplication and photon counting. The use of inverter circuits in this way enables exclusive operations of a plurality of APDs by using a small number of signal lines, whereby an increase in the circuit area can be prevented. In comparison with a case where counters corresponding to the number of APDs are operated in parallel in each pixel, the number of counters operating at a time can be reduced, whereby the power consumption can be reduced.

According to the present exemplary embodiment, the pulse signal input to the selection circuit 130 in each of the regions A and B is only the signal corresponding to either one of the APDs 143 and 144.

The outputs of the counter circuits 120 and 121 are input to the selection circuit 130. The output of the selection circuit 130 is read out to the vertical output line 16 by the control signal supplied from the selection signal line SEL. The read count values 443 and 444 are subjected to calculation processing by the signal processing circuit 60. More specifically, in a case where the count value 443 is equal to or less than the threshold value a (in a case where the incident light quantity is within the range of the region A), the count value 443 is used as the number of photons. On the other hand, in a case where the count value 443 is equal to or larger than the threshold value a (when the incident light quantity is within the range of the region B), n*x+a is used as the number of photons, where x denotes the count value 444. The linearity of the photon count value is maintained by this calculation processing.

The threshold value a is, for example, the maximum value that can be counted by the counter circuit 120. However, the threshold value a may be an arbitrary value in the countable range of the counter circuit 120. It is desirable that the multiplier of the count value 444 is a value corresponding to the sensitivity ratio between the APDs 143 and 144. However, it is not necessary to use an accurate sensitivity ratio, and a calculation such as addition of a constant may be performed instead of multiplication.

Although, in the present example of operation, connection is configured so that the APD 143 operates first in the Geiger mode, connection may be configured so that the APD 144 operates first. The dynamic range can also be expanded by operating the APD 144 first and then, after a predetermined time period has elapsed, selecting the APD 143 as the APD that operates according to the photon count value. Even in this case, it is desirable that one of the APDs 143 and 144 operates and one counter circuit operates at a time.

FIG. 6 is a plan view schematically illustrating an example configuration of APDs of a pixel of the photoelectric conversion apparatus according to the present exemplary embodiment. Referring to FIG. 6, the N-type semiconductor regions as cathodes of APDs 610 are separated from each other on a semiconductor substrate. In FIG. 6, the cathodes of the eight APDs 610 are electrically connected via a wiring 642. By connecting the eight APDs 610 in this way, an APD equivalent to the APD 143 in FIG. 3A is formed.

In the example configuration illustrated in FIG. 3A, the N-type semiconductor region 226 formed as a ring surrounding the APD 144 (FIG. 3A) is partitioned into eight portions. In the example configuration illustrated in FIG. 6, the eight N-type semiconductor regions 226 are separated from each other by separation regions (P-type semiconductor regions) or other element separation methods.

A relatively high sensitivity photodiode may be formed by connecting a plurality of APDs in this way.

The APDs illustrated in FIGS. 3A and 6 are mere examples. The structures of APDs applicable to the present exemplary embodiment are not limited to the planar and cross-sectional structures illustrated in FIGS. 3A, 3B, and 6.

A second exemplary embodiment will be described below with reference to FIG. 7. According to the present exemplary embodiment, the number of counter circuits in each pixel is reduced below the number of APDs, whereby the pixel is downsized, and furthermore, the power consumption for photon counting can be reduced.

Figure 7:
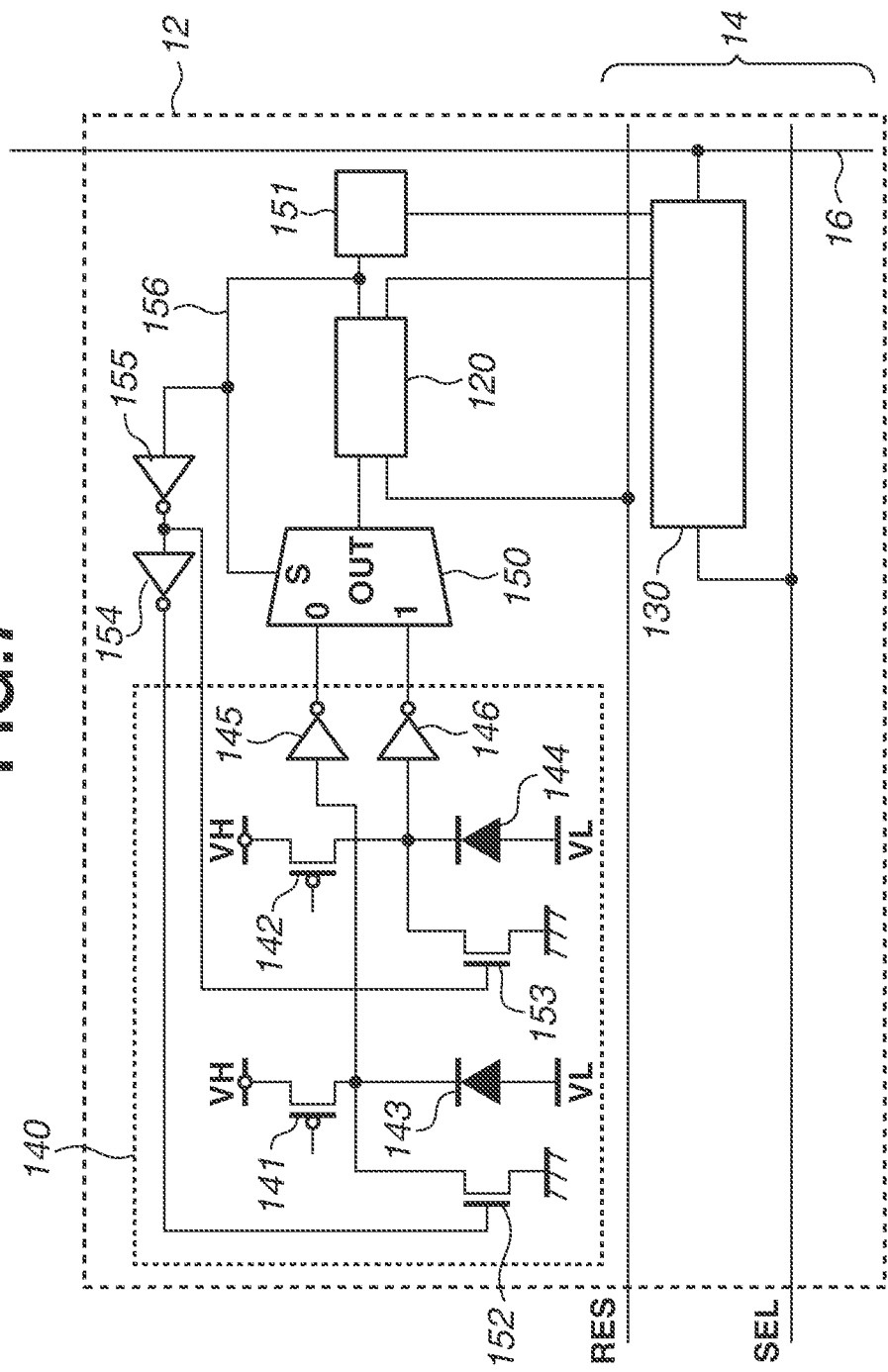
FIG. 7 is a diagram illustrating an example configuration of a pixel circuit of a photoelectric conversion apparatus according to a second exemplary embodiment.

FIG. 7 illustrates an example configuration of a pixel circuit of a photoelectric conversion apparatus according to the present exemplary embodiment.

Elements in FIG. 7 identical to those in FIG. 2 are assigned the same reference numerals as those in FIG. 2, and redundant descriptions thereof will be omitted. Differences from the first exemplary embodiment will be mainly described below.

As illustrated in FIG. 7, a pixel 12 includes a photoelectric conversion portion 140, a counter circuit 120, selection circuits 130 and 150, a saturation detection circuit 151, and inverter circuits 154 and 155.

In the selection circuit 150, in a case where the terminal S is at the Low level, an input to a terminal of a logic value of 0 is output from the OUT terminal. In a case where the terminal S is at the High level, an input to a terminal of a logic value of 1 is output from the OUT terminal.

A terminal of the logic value 0 of the selection circuit 150 is connected from the output terminal of an APD 143 having high-sensitivity via an inverter circuit 145. A terminal of the logic value 1 of the selection circuit 150 is connected from the output terminal of an APD 144 having low-sensitivity via an inverter circuit 146. The output of the selection circuit 150 is input to the counter circuit 120. The S terminal of the selection circuit 150 is connected with the saturation detection circuit 151. In a case where a count value of the counter circuit 120 input to the saturation detection circuit 151 exceeds a predetermined threshold value, the output of the saturation detection circuit 151 changes from the Low to the High level.

The saturation detection circuit 151 holds a part of the output, i.e., the levels of the Low signal or the High signal, of the counter circuit 120. The saturation detection circuit 151 is connected to the selection circuit 130, and the level of the held signal is read out to a vertical output line 16 together with the count result.

As described above, the dynamic range is expanded by using the APDs having different photosensitivities. However, if the counter circuits corresponding to the number of APDs are disposed to perform photon counting with a plurality of APDs, the pixel area and the degree of freedom of the pixel configuration are limited.

A method for solving the issue according to the present exemplary embodiment will be described below.

The graph illustrating the relation between the number of incident photons in unit time and unit area and the photon count value according to the present exemplary embodiment is similar to the graph in FIG. 5. Referring to FIG. 5, the horizontal axis is assigned the number of incident photons in unit time and unit area, and the vertical axis is assigned the photon count value in the counter circuit 120. A plot of a count value 443 in FIG. 5 indicates a photon count value corresponding to the APD 143 in FIG. 7. A plot of a count value 444 indicates a photon count value corresponding to the APD 144 in FIG. 7. The plot of the count value 445 indicates a relation between the number of incident photons in unit time and unit area after image processing and a photon count value after calculation processing according to the present exemplary embodiment.

According to the present exemplary embodiment, for example, the sensitivity ratio between the APDs 143 and 144 is n. This means that a count value corresponding to the APD 143 is n times of a count value corresponding to the APD 144 in a state where an equal light quantity is incident.

A description will be given of a case of a region A where a small number of photons are incident will be considered. The output of the terminal of the logic value 0 of the selection circuit 150 is input to the counter circuit 120, and the output of the counter circuit 120 is partially input to the inverter circuit 155 as the Low level. The output of the inverter circuit 155 and the gate voltage of a NMOS transistor 153 become the High level, and the NMOS transistor 153 turns ON. On the other hand, the output of the inverter circuit 154 and the gate voltage of a NMOS transistor 152 become the Low level, and the NMOS transistor 152 turns OFF.

The source of the NMOS transistor 153 is connected to the ground potential. Then, in a case where the NMOS transistor 153 turns ON, the potential of the cathode (node N) of the APD 144 becomes 0 V, and the reverse bias voltage applied to the APD 144 becomes equal to or lower than the breakdown voltage. In this state, even in a case where electrons are generated by photons, the electrons are discharged via a P-type MOS transistor 142 without causing the avalanche multiplication. Since a current by elementary electric charges is very small, and a voltage drop by the P-type MOS transistor 142 is very small, no pulse signal exceeding a threshold value of the inverter circuit 146 is output. More specifically, the NMOS transistor 153 functions as a switch for stopping the avalanche multiplication of the APD 144.

Meanwhile, since the gate of the NMOS transistor 152 is at the Low level, the NMOS transistor 152 is OFF. As described above, the APD 143 operates in the Geiger mode to perform photon counting.

In a case where the output of the counter circuit 120 reaches a threshold value a, a signal level of a wiring 156 changes from Low to High. The gate voltage of the NMOS transistor 153 connected to the output terminal of the inverter circuit 155 becomes the Low level, and the NMOS transistor 153 turns OFF. On the other hand, the gate voltage of the NMOS transistor 152 connected to the output terminal of the inverter circuit 154 becomes the High level, and the NMOS transistor 152 turns ON.

More specifically, in a case where the output of the counter circuit 120 reaches the threshold value a, the avalanche multiplication of the APD 143 stops. In a case where the photon count value reaches the threshold value a, the count value 443 becomes constant. Meanwhile, the APD 144 starts the operation in the Geiger mode, and the count value 444 starts being incremented.

The input to the S terminal of the selection circuit 150 becomes the High level, and the input to the terminal of the logic value 1 is output from the selection circuit 150.

Accordingly, in a case where a small number of photons are incident and linearity maintained photon counting can be performed with the APD 143 having a high photosensitivity (in a case of the region A), only the APD 143 operates in the Geiger mode. In a case where a large number of photons are incident, and pileup occurs in the APD 143 (in a case of the region B), only the APD 144 is operated in the Geiger mode.

Since the signal input to the counter circuit 120 corresponds to either one of the APDs 143 and 144, photon counting is possible with one counter circuit 120 for the two APDs.

By changing the count processing based on a magnitude relation between the threshold value detected by the saturation detection circuit 151 and the count value in this way, a continuous rectilinear signal after the calculation processing as illustrated in FIG. 4 can be obtained.

According to the present exemplary embodiment, since the number of counter circuits can be less than the number of APDs in each pixel, it is possible to achieve further size reduction and narrower pitch of pixels than in the photoelectric conversion apparatus according to the first exemplary embodiment. Also, like the first exemplary embodiment, since the number of counters of the counter circuit 120 can be reduced, the power consumption can also be reduced.

The reduction in the number of counters will be described in detail below.

In a case where photon counting is performed only by the APD 143, for example, to obtain the count value of the 16th power of 2 in decimal by using a 16-bit counter, counting needs to be performed 65,536 times, and thus power for this count value is consumed.

On the other hand, a case where photon counting is performed by switching between the APDs 143 and 144 according to the present exemplary embodiment will be described below. A description will be given of a case where the sensitivity ratio n between the APDs 143 and 144 is 16, and the threshold value a is 4,096. The signal of the APD 143 is counted until the photon count value reaches the threshold value a. When the photon count value exceeds the threshold value, the count value of the APD 144 is multiplied by 16 and then 4,096 is added to the product to obtain the photon count value. In this case, the count value corresponding to the signal of the APD 144 can be 65,536/16=4,096 before the photon count value reaches 65,536. Thus, the total count value before the count value reaches 65,536 is 4,096+4,096=8,192. This means that the total count value can be reduced, whereby the power consumption can be reduced.

In the range where the signal of the APD 144 is used, the resolution decreases to 1/n times in comparison with the resolution in a case where the signal of the APD 143 is used. In this range, light shot noise has a large effect because of a sufficient light quantity, and thus the reduced resolution has a small effect.

Further, according to the present exemplary embodiment, it is not necessary to output signals of both the APDs 143 and 144 from the photoelectric conversion portion 140. Signals that need to be read out to a signal processing circuit 60 include the count result of the counter circuit 120 and the saturation signal, whereby the read speed can be increased.

According to the present operation example, the selection circuit 150 first selects the output of the APD 143 to forward the output of the APD 143 to the counter circuit 120. However, the selection circuit 150 may first forward the output of the APD 144 to the counter circuit 120. The dynamic range can also be expanded by forwarding the output of the APD 144 first and then, after a predetermined time period has elapsed, changing the output in accordance with the photon count value of the APD 144. Even in this case, one of the APDs 143 and 144 operates and one counter circuit operates at a time.

A third exemplary embodiment will be described below with reference to FIGS. 8 and 9. According to the present exemplary embodiment, power consumption related to photon counting can be reduced by setting a photoelectric conversion portion to be used for light detection for each pixel.

Figure 8:
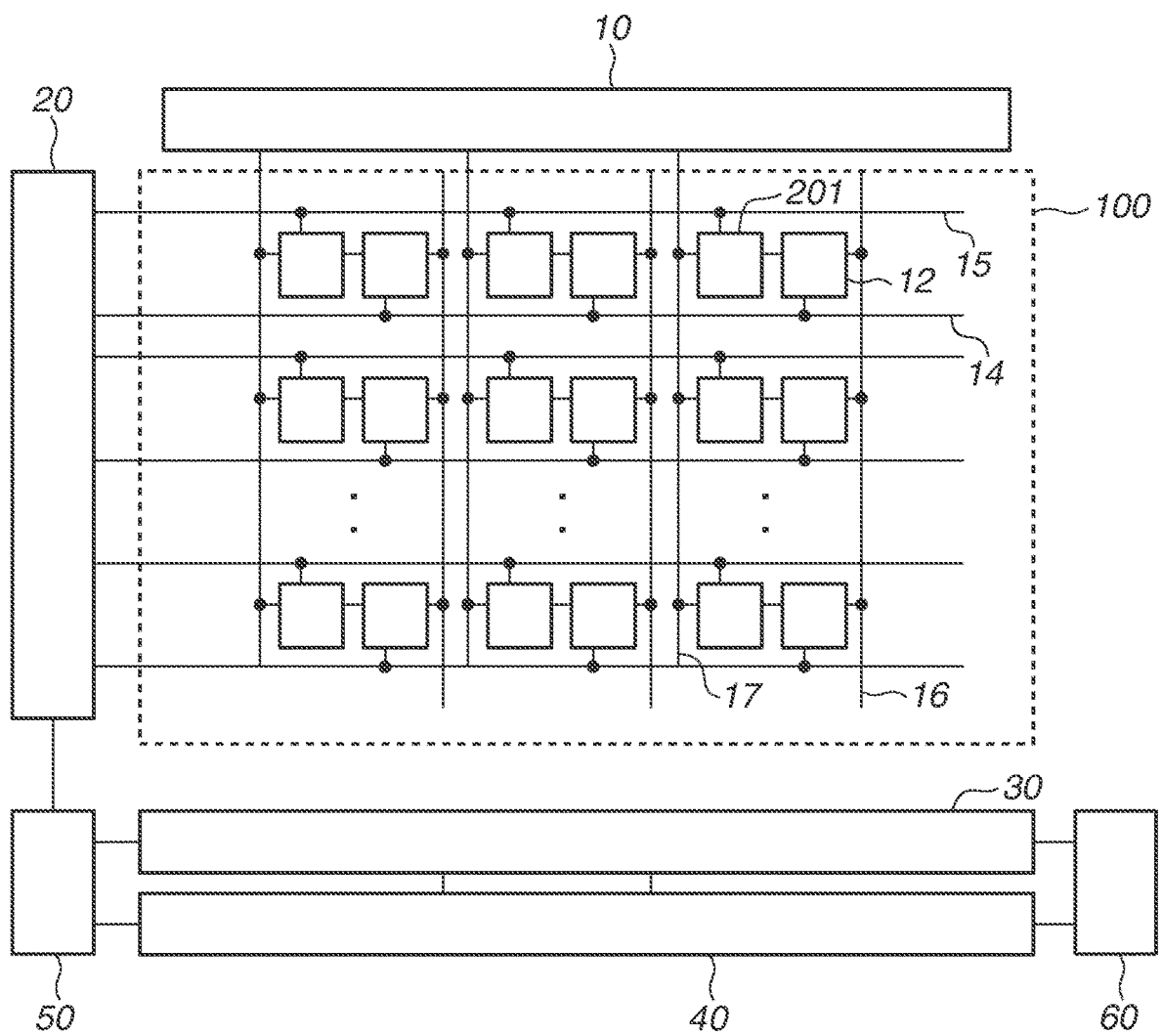
FIG. 8 is a schematic view illustrating a photoelectric conversion apparatus according to a third exemplary embodiment.
Figure 9:
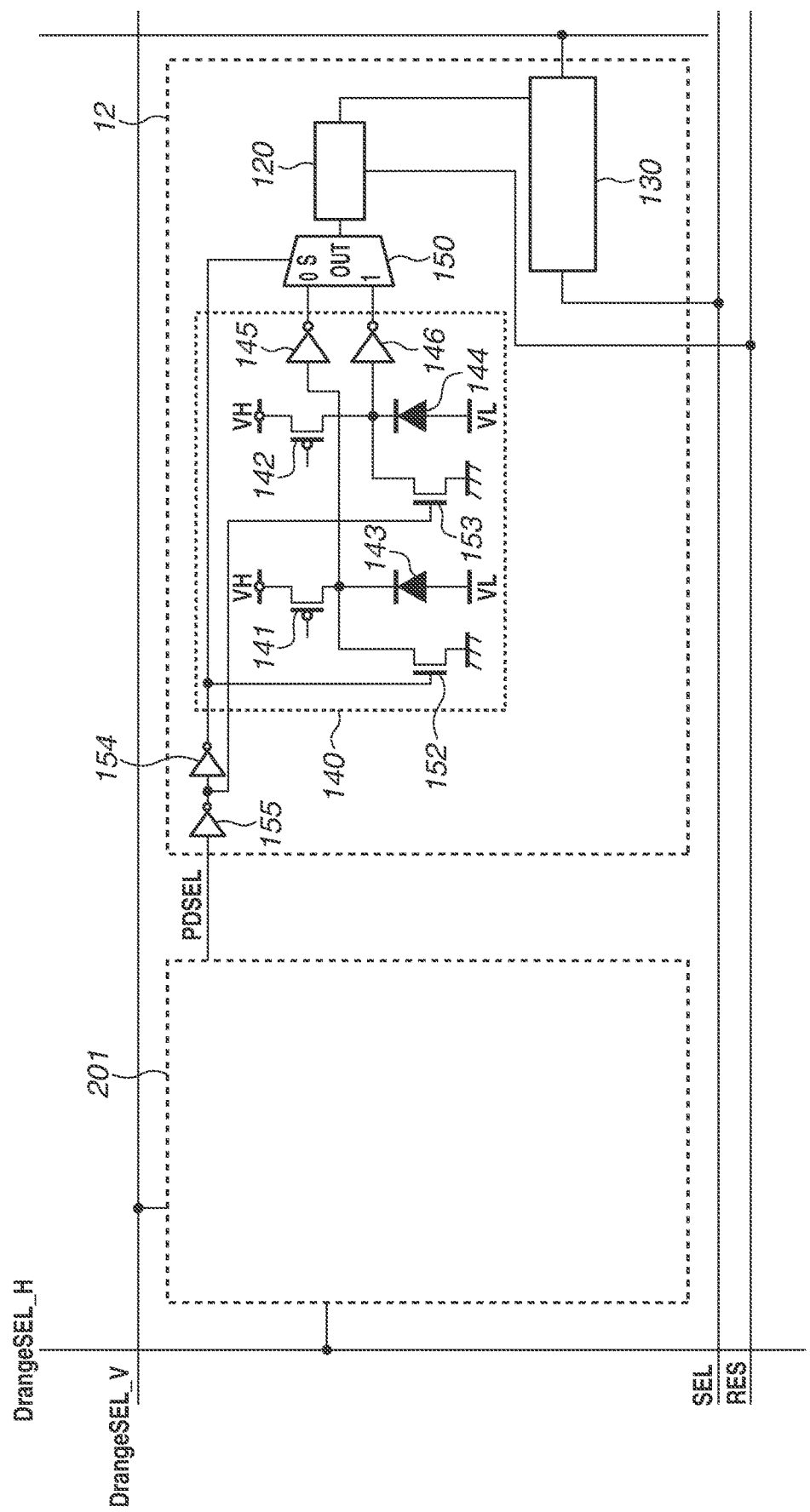
FIG. 9 is a diagram illustrating an example configuration of a pixel circuit of the photoelectric conversion apparatus according to the third exemplary embodiment.

FIG. 8 schematically illustrates a photoelectric conversion apparatus according to the present exemplary embodiment. FIG. 9 illustrates an example configuration of a pixel circuit of the photoelectric conversion apparatus according to the present exemplary embodiment. Descriptions duplicated with the first and the second exemplary embodiments will be omitted, and differences from the first and the second exemplary embodiments will be mainly described below.

Overall Configuration of Photoelectric Conversion Apparatus

As illustrated in FIG. 8, a photoelectric conversion apparatus 1000 according to the present exemplary embodiment includes a pixel region 100, a dynamic range control circuit 10, a vertical scanning circuit 20, a column readout circuit 30, a horizontal scanning circuit 40, a control circuit 50, and a signal processing circuit 60.

The pixel region 100 includes a plurality of pixels 12 arranged in matrix form over a plurality of rows and a plurality of columns, and a plurality of dynamic range control circuits 201. Each row of the pixel array in the pixel region 100 is provided with a control signal line 14 that extend in the row direction (horizontal direction in FIG. 1). The control signal lines 14 are connected to the pixels 12 arranged in the row direction and the dynamic range control circuits 201 and serves as common signal lines for the pixels 12 and the dynamic range control circuits 201. Each column of the pixel array in the pixel region 100 is provided with a vertical output line 16 that extends in the column direction (vertical direction in FIG. 1). The vertical output lines 16 are connected to the pixels 12 arranged in the column direction and serves as common signal lines for these pixels 12. Each column of the pixel array in the pixel region 100 is further provided with a control signal line 17 that extends in the column direction (vertical direction in FIG. 1).

The control signal line 14 in each row is connected to the vertical scanning circuit 20. The vertical scanning circuit 20 is a circuit unit that supplies a control signal, which is for driving a readout circuit in each of the pixels 12 when pixel signals are read out from the pixels 12, to the pixels 12 via the control signal lines 14.

A control signal line 15 in each row is connected to the vertical scanning circuit 20. The vertical scanning circuit 20 supplies a control signal to the dynamic range control circuits 201 via the control signal line 15.

One end of the vertical output line 16 in each column is connected to the column readout circuit 30. Pixel signals read out from the pixels 12 are input to the column readout circuit 30 via the vertical output lines 16. The column readout circuit 30 can include a memory for holding the pixel signals read out from the pixels 12.

One end of the control signal line 17 in each row is connected to the dynamic range control circuit 10.

The dynamic range control circuit 10 is a circuit unit that supplies a dynamic range control signal to the dynamic range control circuit 201 via the control signal line 17.

The horizontal scanning circuit 40 is a circuit unit that supplies, to the column readout circuit 30, control signals for sequentially transferring the pixel signals held by the column readout circuit 30 to the signal processing circuit 60 for each column. The control circuit 50 is a circuit unit that supplies control signals for controlling operations and timings of the vertical scanning circuit 20, the column readout circuit 30, and the horizontal scanning circuit 40. The signal processing circuit 60 processes the pixel signals.

Pixel Configuration

A configuration and connection relation between the pixel 12 and the dynamic range control circuit 201 according to the present exemplary embodiment will be described below. FIG. 9 is a block diagram or equivalent circuit diagram schematically illustrating an overall configuration of the pixel 12 and the dynamic range control circuit 201. As illustrated in FIG. 9, each of the pixels 12 includes a photoelectric conversion portion 140, a counter circuit 120, selection circuits 130 and 150, and inverter circuits 154 and 155.

The photoelectric conversion portion 140 includes APDs 143 and 144. Each of anodes of the APDs 143 and 144 are connected to a power source that supplies the voltage VL. A cathode of the APD 143 is serially connected to an input terminal of P-type MOS transistor 141 and an input terminal of an inverter circuit 145. A cathode of the APD 144 is serially connected to an input terminal of a P-type MOS transistor 142 and an input terminal of an inverter circuit 146. P-type MOS transistors 141 and 142 are each connected to a power source that supplies a voltage VH that is higher than a voltage VL.

A gate of an NMOS transistor 152 is connected to an output terminal of the inverter circuit 154.

The NMOS transistor 152 is further serially connected to the ground potential and the anode of the APD 143. A gate of an NMOS transistor 153 is connected to an output terminal of the inverter circuit 155. More specifically, the photoelectric conversion portion 140 includes the inverter circuit 154 between control nodes of the NMOS transistors 152 and 153. The NMOS transistor 153 is further serially connected to the ground potential and the anode of the APD 144.

The output terminal of the inverter circuit 155 is connected to the gate of the NMOS transistor 153 and an input terminal of the inverter circuit 154. The output of the inverter circuit 154 is connected to the gate of the NMOS transistor 152. An input terminal of the inverter circuit 155 is connected with the dynamic range control circuit 201 via a PD selection line PDSEL.

Output terminals of the inverter circuits 145 and 146 serve as output nodes of the photoelectric conversion portion 140. The output terminals of the inverter circuits 145 and 146 are connected to the selection circuit 150.

An output of the selection circuit 150 is input to the counter circuit 120. An output of the counter circuit 120 is connected to the vertical output line 16 via the selection circuit 130.

In the selection circuit 150, in a case where the terminal S is at the Low level, an input to a terminal of a logic value 0 is output from the OUT terminal. In a case where the terminal S is at the High level, an input of a terminal of a logic value 1 is output from the OUT terminal. The terminal of the logic value 0 of the selection circuit 150 is connected from the output terminal of the APD 143 having high-sensitivity via the inverter circuit 145. The terminal of the logic value 1 of the selection circuit 150 is connected from the output terminal of the APD 144 having low-sensitivity via the inverter circuit 146. The output of the selection circuit 150 is input to the counter circuit 120. The S terminal of the selection circuit 150 is connected with the output terminal of the inverter circuit 154. The output of the inverter circuit 154 changes from the Low level to the High level or vice versa in accordance with an output signal of the dynamic range control circuit 201 input to the inverter circuit 155.

A control signal is input to the dynamic range control circuit 201 via the control signal line 15 (DrangeSEL_V). The output of the dynamic range control circuit 10 is input to the dynamic range control circuit 201 via the control signal line 17 (DrangeSEL_H).

As described above, the dynamic range is expanded by using the APDs having different photosensitivities. However, in a case of enabling each of the plurality of APDs in a pixel to perform photon counting for the purpose of using different APDs for light detection according to the light intensity, a circuit for controlling operation of each APD is required. This results in an increase in the circuit area, and the power consumption is also increased.

Example of Operation

A method for solving the issue according to the present exemplary embodiment will be described below.

According to the present exemplary embodiment, the APD to be used for light detection in each pixel is predetermined according to the dynamic range control signal output from the dynamic range control circuit 10.

A description will be given of a case where the APD 143 is used for light detection. In this case, the output of the dynamic range control circuit 201 is at the Low level. The output of the inverter circuit 155 and the input of the NMOS transistor 153 are at the High level. Meanwhile, the output of the inverter circuit 154 and the input of the NMOS transistor 152 are at the Low level. The output at the Low level of the inverter circuit 154 is also input to the S terminal of the selection circuit 150. When the terminal S is at the Low level, the OUT terminal of the selection circuit 150 outputs the input to the terminal of the logic value 0, i.e., the selection circuit 150 outputs the output of the inverter circuit 154.

In a case where the gate voltage of the NMOS transistor 153 becomes the High level, the NMOS transistor 153 turns ON. Meanwhile, the output of the inverter circuit 154 and the gate voltage of the NMOS transistor 152 become the Low level, and the NMOS transistor 152 turns OFF.

Since the NMOS transistor 153 is connected to the ground potential, in a case where the NMOS transistor 153 turns ON, the cathode potential of the APD 144 becomes 0 V, and the reverse bias voltage applied to the APD 144 becomes equal to or lower than the breakdown voltage. In this state, even in a case where electrons are generated by photons, the electrons are discharged via the P-type MOS transistor 142 without causing the avalanche multiplication. Since the current by elementary electric charges is very small, a voltage drop by the P-type MOS transistor 142 is also very small. Thus, no pulse signal exceeding the threshold value of the inverter circuit 146 is output. More specifically, the NMOS transistor 153 functions as a switch for stopping the avalanche multiplication of the APD 144.

Meanwhile, since the gate of the NMOS transistor 152 is at the Low level, the NMOS transistor 152 is OFF. As described above, the APD 143 operates in the Geiger mode to perform photon counting. The output of the APD 143 is shaped into a pulse wave by the inverter circuit 145. The pulse wave output from the inverter circuit 145 is input to the counter circuit 120 via the terminal of the logic value 0 of the selection circuit 150. The counter circuit 120 counts the total number of photons detected by the APD 143.

In a case where the APD 143 is used for light detection in this way, the APD 143 causes the avalanche multiplication. Meanwhile, the APD 144 causes neither the avalanche multiplication nor photon counting. On the other hand, in a case where the APD 144 is used for light detection, the APD 143 stops the avalanche multiplication and does not cause photon counting. The APD 144 causes the avalanche multiplication and photon counting. The use of inverter circuits in this way enables achieving a configuration in which, when one APD operates, the other APD does not operate, without remarkably increasing the circuit area. In comparison with a case where a large APD, a small APD, and counters corresponding to the APDs are operated for each pixel, the number of APDs operating at a time can be reduced, whereby power consumption can be reduced.

Although, in the present exemplary embodiment, all of the pixels on the pixel region 100 have the structure of the pixel 12, the present disclosure is not limited thereto. Only some pixels may have the structure of the pixel 12. Even in this case, effects of reducing the circuit area and reducing the power consumption are obtained according to the ratio of pixels having the structure of the pixel 12.

Figure 10:
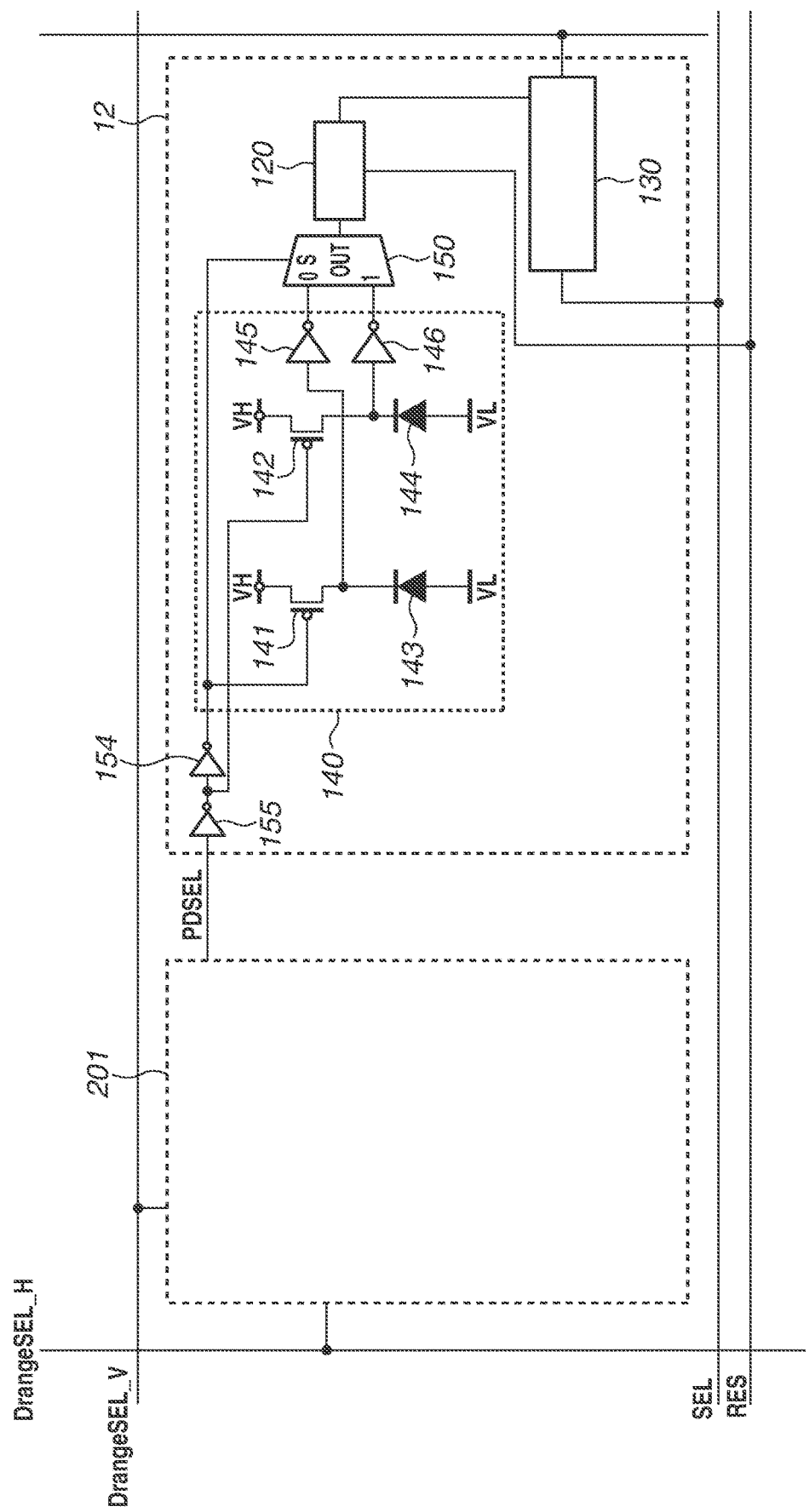
FIG. 10 is a diagram illustrating another example configuration of the pixel circuit of the photoelectric conversion apparatus according to the third exemplary embodiment.

Although, in the present exemplary embodiment, the NMOS transistors 152 and 153 are used as switches for stopping the avalanche multiplication, the present disclosure is not limited thereto. For example, as illustrated in FIG. 10, the P-type MOS transistors 141 and 142 may be used as similar switches. This configuration enables exclusively operating a plurality of APDs without the NMOS transistors 152 and 153, which makes it possible to further reduce the circuit area.

In the above descriptions, each pixel includes the inverter circuits 154 and 155.

Such a configuration enables selecting the APD to be used for each individual pixel.

However, the present disclosure is also applicable to a case where, for example, an inverter circuit is shared by a plurality of pixels. In this case, an APD to be selected is fixed depending on the element connection state between pixels that share the inverter circuit. However, this configuration enables reducing the total number of required circuits, whereby the circuit area and power consumption can be further reduced.

In the implementation of the present exemplary embodiment, the APD to be used may be differentiated by location, for example, between the center and the outer edge of the pixel array. Alternatively, only one of the APD 143 and 144 may be used to perform light detection over the entire pixel array.

As described above, expansion of the dynamic range and reduction of shading are expected by differentiating the APD to be used by location in the pixel array. More specifically, on the outer edge of the pixel array where shading is likely to occur, the APD 143 having a large pixel area is used. At the center of the pixel array where a small quantity of high angle light exists, the APD 144 is used or the APDs 143 and 144 are selectively used.

Using only either one of the APDs in the entire pixel array as in the latter case enables improving the in-plane uniformity of sensitivity.

Which APD is to be used in each pixel may be determined by the user's mode selection, or determined according to the output signal from an AE sensor disposed to obtain luminance information. According to the pixel signal captured in a certain frame, the APD to be used by each pixel in the following frame may be selected.

Figure 11:
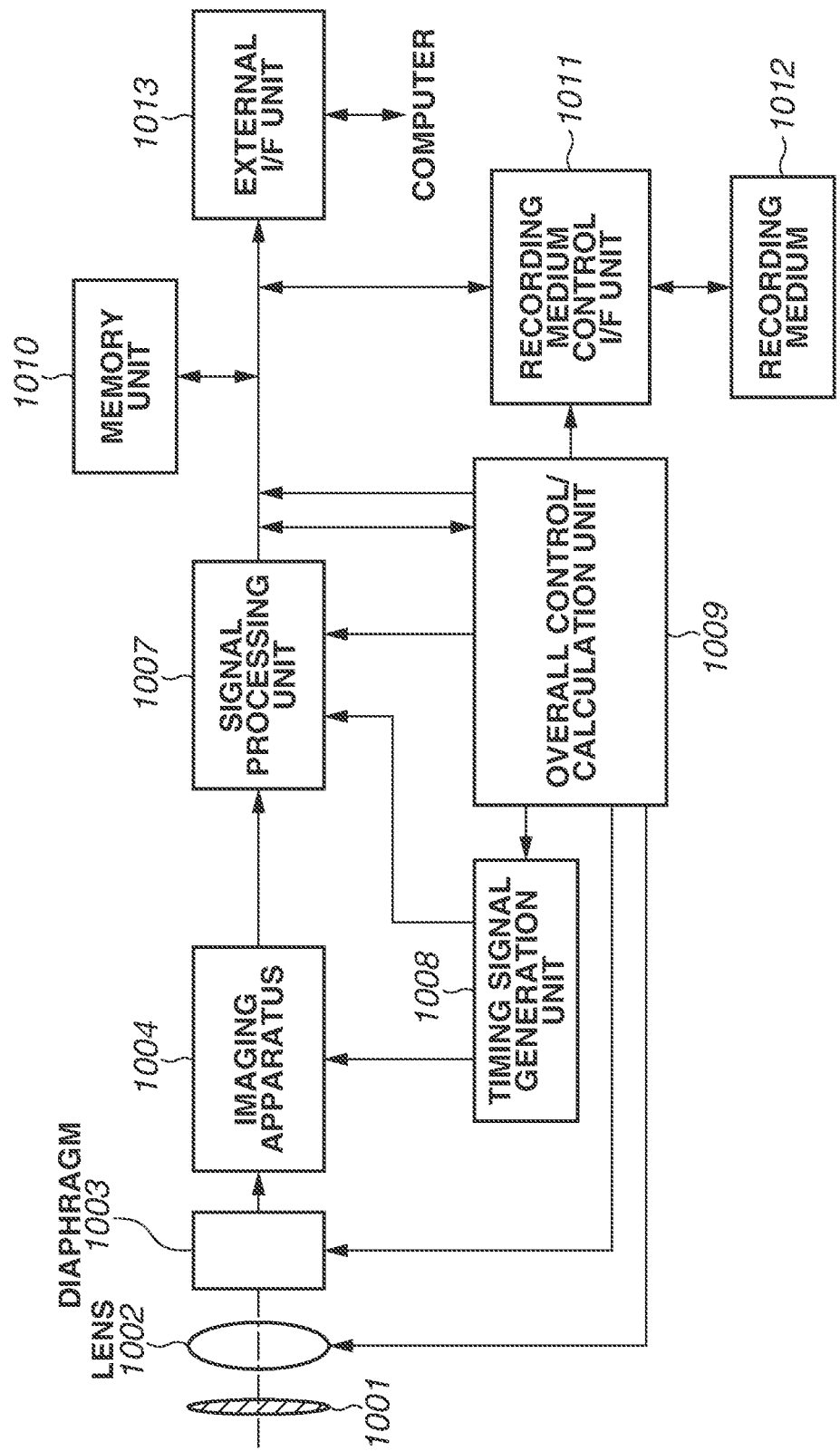
FIG. 11 is a block diagram illustrating an overall configuration of an imaging system according to a fourth exemplary embodiment.

A photoelectric conversion system according to a fourth exemplary embodiment will be described below with reference to FIG. 11. FIG. 11 is a block diagram illustrating an overall configuration of the photoelectric conversion system according to the present exemplary embodiment.

The photoelectric conversion apparatuses according to the first to the third exemplary embodiments are applicable to various types of photoelectric conversion systems. Examples of applicable photoelectric conversion systems include digital still cameras, digital camcorders, surveillance cameras, copying machines, facsimiles, portable telephones, on-vehicle cameras, and observation satellites. A camera module including an optical system, such as a lens and an imaging apparatus, is also included in the photoelectric conversion system. FIG. 11 is a block diagram illustrating a digital still camera as an example of a photoelectric conversion system.

An example of a photoelectric conversion system illustrated in FIG. 11 includes an imaging apparatus 1004 as an example of a photoelectric conversion apparatus, and a lens 1002 that forms the optical image of a subject on an imaging apparatus 1004. The photoelectric conversion system further includes a diaphragm 1003 that changes the light quantity passing through the lens 1002, and a barrier 1001 that protects the lens 1002. The lens 1002 and the diaphragm 1003 configure an optical system that condenses light to the imaging apparatus 1004. The imaging apparatus 1004, as a photoelectric conversion apparatus according to any one of the above-described exemplary embodiments, converts an optical image formed by the lens 1002 into an electrical signal.

The photoelectric conversion system further includes a signal processing unit 1007 as an image generation unit that generates an image by processing an output signal output from the imaging apparatus 1004. The signal processing unit 1007 performs various correction and compression as required and outputs image data. The signal processing unit 1007 may be formed on a semiconductor substrate provided with the imaging apparatus 1004, or on a semiconductor substrate different from the substrate provided with the imaging apparatus 1004.

The photoelectric conversion system further includes a memory unit 1010 that temporarily stores image data, and an external interface (I/F) unit 1013 that communicates with an external computer. The photoelectric conversion system further includes a recording medium 1012, such as a semiconductor memory, to be used to record and read imaging data, and a recording medium control I/F unit 1011 to be used to record and read imaging data to/from the recording medium 1012. The recording medium 1012 may be built in the photoelectric conversion system, or may be detachable from the photoelectric conversion system.

The photoelectric conversion system further includes an overall control/calculation unit 1009 that performs various calculations and controls the entire digital still camera, and a timing signal generation unit 1008 that outputs various timing signals to the imaging apparatus 1004 and the signal processing unit 1007. The timing signals may be input from the outside. The photoelectric conversion system includes at least the imaging apparatus 1004 and the signal processing unit 1007 that processes an output signal output from the imaging apparatus 1004.

The imaging apparatus 1004 outputs an imaging signal to the signal processing unit 1007. The signal processing unit 1007 performs predetermined signal processing on an imaging signal output from the imaging apparatus 1004 to and outputs image data. The signal processing unit 1007 generates an image by using the imaging signal.

According to the present exemplary embodiment, a photoelectric conversion system to which the photoelectric conversion apparatus (imaging apparatus) according to either one of the above-described exemplary embodiments is applied can be implemented.

Figure 12A:
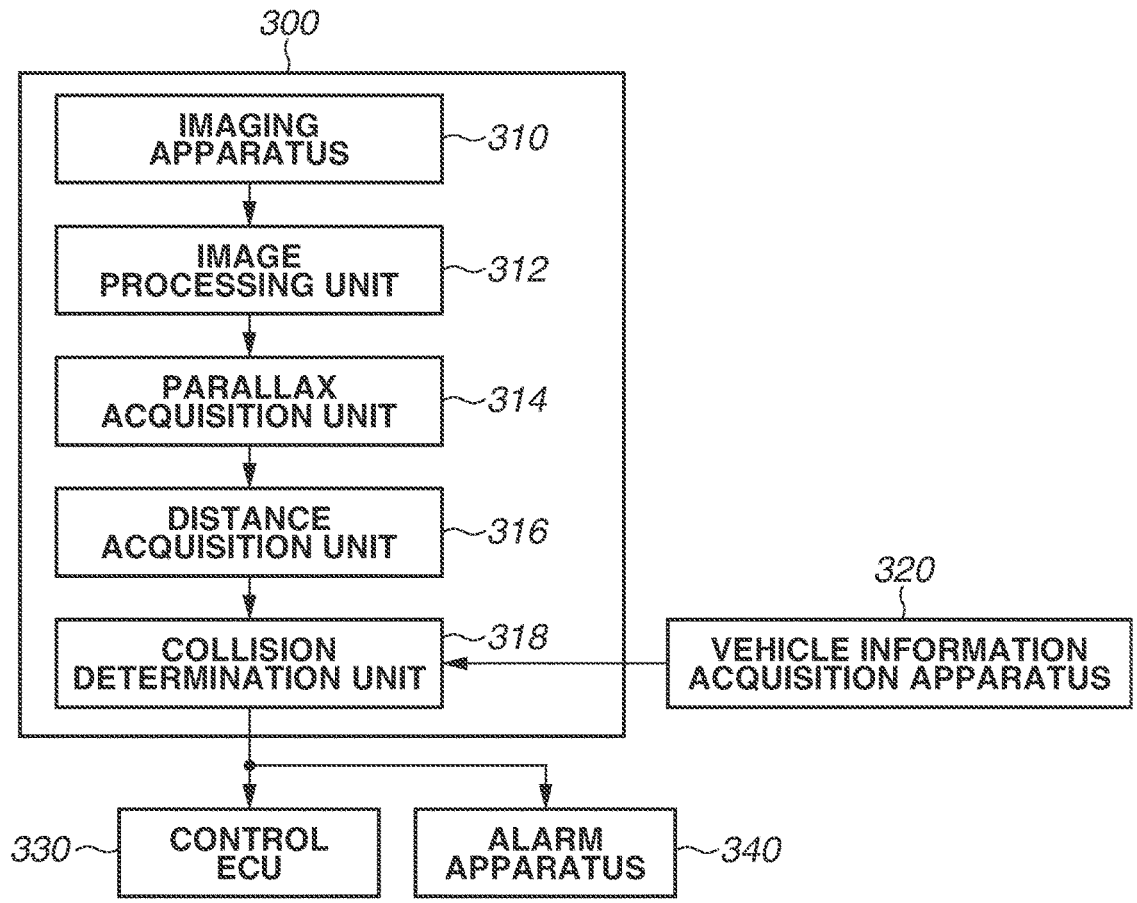
FIGS. 12A and 12B are diagrams illustrating example configurations of an imaging system and a moving body, respectively, according to a fifth exemplary embodiment.
Figure 12B:
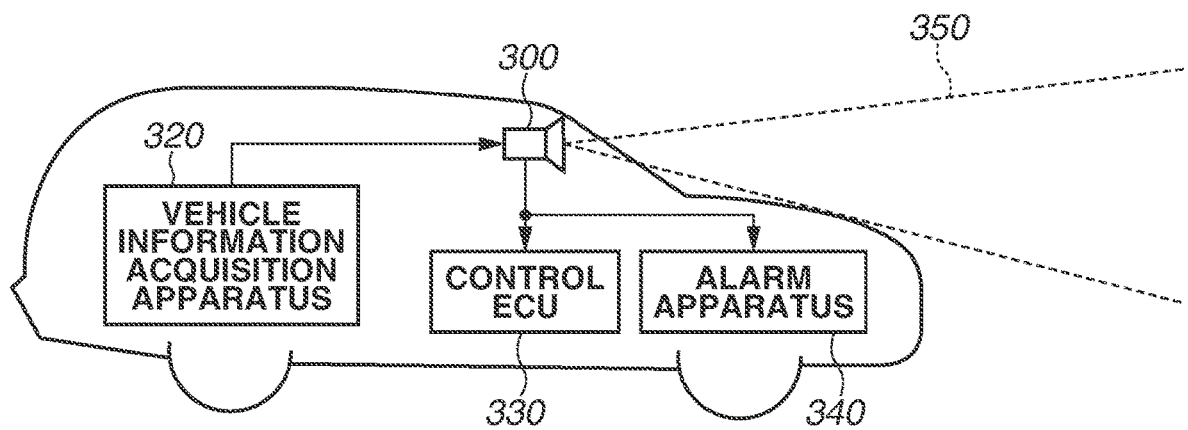

A photoelectric conversion system and a moving body according to a fifth exemplary embodiment will be described below with reference to FIGS. 12A and 12B, respectively. FIGS. 12A and 12B illustrate configurations of the photoelectric conversion system and the moving body, respectively, according to the present exemplary embodiment.

FIG. 12A illustrates an example of a photoelectric conversion system related to an on-vehicle camera. A photoelectric conversion system 300 includes an imaging apparatus 310. The imaging apparatus 310 is the photoelectric conversion apparatus (imaging apparatus) according to either one of the above-described exemplary embodiments. The photoelectric conversion system 300 includes an image processing unit 312 that performs image processing on a plurality of image data pieces acquired by the imaging apparatus 310, and a parallax acquisition unit 314 that calculates the parallax (phase difference of parallax images) based on the plurality of image data pieces acquired by the imaging apparatus 310. The photoelectric conversion system 300 further includes a distance acquisition unit 316 that calculates the distance to a target object based on the calculated parallax, and a collision determination unit 318 that determines the possibility of collision based on the calculated distance. The parallax acquisition unit 314 and the distance acquisition unit 316 are examples of distance information acquisition units for acquiring information about the distance to the target object. More specifically, the distance information includes information about a parallax, a defocus amount, and a distance to the target object. The collision determination unit 318 may determine the possibility of collision by using one of these pieces of the distance information. The distance information acquisition units may be implemented by specially designed hardware components or implemented by software modules. The distance information acquisition units may also be implemented by a Field Programmable Gate Array (FPGA), an Application Specific Integrated Circuit (ASIC), or a combination of both.

The photoelectric conversion system 300 is connected with a vehicle information acquisition apparatus 320 to acquire vehicle information, such as a vehicle speed, a yaw rate, and a steering angle. The photoelectric conversion system 300 is connected with a control Electronic Control Unit (ECU) 330 as a control apparatus that outputs control signals for generating a braking force on a vehicle based on the determination result by the collision determination unit 318. The photoelectric conversion system 300 is also connected with a warning apparatus 340 that generates an alarm to a driver based on a determination result by the collision determination unit 318. For example, in a case where a possibility of collision is high based on a determination result by the collision determination unit 318, the control ECU 330 performs vehicle control to avoid a collision and reduce damages, for example, by applying brakes, releasing the accelerator, or restraining the engine power. The warning apparatus 340 warns the driver by generating an alarm sound, displaying alarm information on the screen of a car navigation system, or applying a vibration to a seat belt or a steering wheel.

According to the present exemplary embodiment, the photoelectric conversion system 300 captures images of the surrounding of the vehicle, for example, images ahead or behind the vehicle. FIG. 12B illustrates a photoelectric conversion system that captures images ahead of the vehicle (imaging range 350). The vehicle information acquisition apparatus 320 transmits an instruction to the photoelectric conversion system 300 or the imaging apparatus 310. The above-described configuration enables improving accuracy of distance measurement.

While the present exemplary embodiment has been described above centering on control for avoiding a collision with other vehicles, the present exemplary embodiment is also applicable to automatic driving control for following another vehicle and automatic driving control for retaining the vehicle within a lane. The photoelectric conversion system is applicable not only to vehicles, such as automobiles, but also to moving bodies (moving apparatuses) such as vessels, airplanes, and industrial robots. In addition, the photoelectric conversion system is applicable not only to moving bodies but also to intelligent transport systems (ITS's) and a wide range of apparatuses utilizing object recognition.

Modifications

The present disclosure is not limited to the above-described exemplary embodiments but can be modified in diverse ways.

For example, the present exemplary embodiments also include a case in which a part of the configuration of another exemplary embodiment is appended, or an exemplary embodiment in which a part of the configuration is replaced with a part of the configuration of another exemplary embodiment.

Although the present exemplary embodiment uses two different types of APDs, i.e., the APD having high-sensitivity and the APD having low-sensitivity, the present disclosure is not limited thereto. For example, three or more types of APDs are used, and either one of the APDs operates in the Geiger mode. Increasing the types of APDs enables implementing a wider dynamic range.

While, in the exemplary embodiments, a plurality of APDs in one pixel is disposed in one N-type semiconductor region 224, each of the APDs may be disposed in a different N-type semiconductor region 224. Disposing the APDs in different N-type semiconductor regions 224 in this way enables expecting the improvement in the degree of freedom of the arrangement on a substrate.

The photoelectric conversion systems according to the fourth and the fifth exemplary embodiments are taken as examples to which a photoelectric conversion apparatus is applicable. The photoelectric conversion systems to which the photoelectric conversion apparatus of the present disclosure is applicable are not limited to the configurations illustrated in FIGS. 11, 12A, and 12B.

The above-described exemplary embodiments are illustrative cases for implementing the present exemplary embodiments, and are not to be interpreted as restrictive of the technical scope of the present disclosure. The present exemplary embodiments may be embodied in diverse forms without departing from the technical concepts or essential characteristics thereof.

According to the present exemplary embodiments, a circuit area on a photoelectric conversion apparatus using avalanche diodes and power consumption in photon counting by the photoelectric conversion apparatus can be reduced.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-205112, filed Dec. 10, 2020, which is hereby incorporated by reference herein in its entirety.

What is claimed is:
1. A photoelectric conversion apparatus comprising:
a plurality of pixels each including a first avalanche photodiode and a second avalanche photodiode having a light-receiving surface area size different from a light-receiving surface area size of the first avalanche photodiode,
a counter circuit configured to count a first signal based on an electric charge generated in the first avalanche photodiode and a second signal based on an electric charge generated in the second avalanche photodiode, and
a control circuit,
wherein the first avalanche photodiode is connected between a first waveform shaping circuit and a first switch, and the second avalanche photodiode is connected between a second waveform shaping circuit and a second switch,
wherein an inverter circuit is connected between a control node of the first switch and a control node of the second switch,
wherein which of the first avalanche photodiode and the second avalanche photodiode is applied with the reverse bias voltage equal to or higher than the breakdown voltage is different between a case where a count value including either one of the first signal and the second signal is larger than a threshold value and a case where the count value is smaller than the threshold value, and
wherein the control circuit is configured to stop, in a case where the count value reaches the threshold value, applying the reverse bias voltage equal to or higher than the breakdown voltage to the first avalanche photodiode.

2. The photoelectric conversion apparatus according to claim 1, wherein the control circuit is configured to control the first switch and the second switch to set the first switch and the second switch to be in either one of an ON state and an OFF state.

3. The photoelectric conversion apparatus according to claim 2, wherein the inverter circuit is connected between the first switch and the control circuit.

4. The photoelectric conversion apparatus according to claim 1,
wherein in a case where the first switch is in an OFF state, the first avalanche photodiode is applied with a reverse bias voltage equal to or higher than a breakdown voltage, and wherein in a case where the first switch is in an ON state, the first avalanche photodiode is not applied with the reverse bias voltage equal to or higher than the breakdown voltage.

5. The photoelectric conversion apparatus according to claim 1, wherein the first switch is serially connected between the first avalanche photodiode and a reference voltage source.

6. The photoelectric conversion apparatus according to claim 1,
wherein the first switch and the second switch are set to be in either one of an ON state and an OFF state, and
wherein a state set in the first switch and a state set in the second switch are different from each other.

7. The photoelectric conversion apparatus according to claim 1, wherein each of the plurality of pixels includes the inverter circuit.

8. The photoelectric conversion apparatus according to claim 1, wherein some pixels included in the plurality of pixels are connected to the inverter circuit shared among the some pixels.

9. The photoelectric conversion apparatus according to claim 1,
wherein each of the first signal and the second signal is a pulse signal corresponding to a voltage change caused by avalanche multiplication, and
wherein a count value output from the counter circuit changes according to at least either one of a change in the first signal and a change in the second signal.

10. The photoelectric conversion apparatus according to claim 1, further comprising:
a sensor configured to obtain luminance information,
wherein, in accordance with the luminance information obtained by the sensor, either one of the first avalanche photodiode and the second avalanche photodiode is applied with the reverse bias voltage equal to or higher than the breakdown voltage.

11. The photoelectric conversion apparatus according to claim 1, further comprising:
a micro lens,
wherein, in each of the plurality of pixels, the first avalanche photodiode and the second avalanche photodiode are disposed under the same micro lens.

12. The photoelectric conversion apparatus according to claim 11, wherein the first avalanche photodiode is an avalanche photodiode disposed under a center of the micro lens, and the second avalanche photodiode is an avalanche photodiode disposed under an outer periphery of the micro lens.

13. A moving body including the photoelectric conversion apparatus according to claim 1, the moving body comprising a control circuit configured to control movement of the moving body by using a signal output from the photoelectric conversion apparatus.

14. A photoelectric conversion apparatus comprising:
a plurality of pixels each including a first avalanche photodiode and a second avalanche photodiode having a light-receiving surface area size different from a light-receiving surface area size of the first avalanche photodiode,
a counter circuit configured to count a first signal based on an electric charge generated in the first avalanche photodiode and a second signal based on an electric charge generated in the second avalanche photodiode, and
a control circuit,
wherein the first avalanche photodiode is connected between a first waveform shaping circuit and a first switch, and the second avalanche photodiode is connected between a second waveform shaping circuit and a second switch,
wherein an inverter circuit is connected between a control node of the first switch and a control node of the second switch,
wherein which of the first avalanche photodiode and the second avalanche photodiode is applied with the reverse bias voltage equal to or higher than the breakdown voltage is different between a case where a count value including either one of the first signal and the second signal is larger than a threshold value and a case where the count value is smaller than the threshold value, and
wherein the control circuit is configured to start, in a case where the count value reaches the threshold value, applying the reverse bias voltage equal to or higher than the breakdown voltage to the second avalanche photodiode.

15. A photoelectric conversion system comprising:
the photoelectric conversion apparatus according to claim 1; and
a processing apparatus configured to process a signal output from the photoelectric conversion apparatus.

* * * * *